United States Patent
Tanaka et al.

(10) Patent No.: US 9,876,577 B2
(45) Date of Patent: Jan. 23, 2018

(54) OPTICAL SIGNAL PROCESSING APPARATUS, OPTICAL SIGNAL PROCESSING METHOD, AND RECORDING MEDIUM

(71) Applicant: FUJITSU LIMITED, Kawasaki-shi, Kanagawa (JP)

(72) Inventors: Toshiki Tanaka, Setagaya (JP); Tomoo Takahara, Kawasaki (JP); Masato Nishihara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/982,058

(22) Filed: Dec. 29, 2015

(65) Prior Publication Data

US 2016/0112139 A1    Apr. 21, 2016

Related U.S. Application Data

(63) Continuation of application No. PCT/JP2013/068444, filed on Jul. 4, 2013.

(51) Int. Cl.
*H04B 10/516* (2013.01)
*H04B 10/077* (2013.01)
(Continued)

(52) U.S. Cl.
CPC ............. *H04B 10/516* (2013.01); *H03F 1/32* (2013.01); *H04B 10/0779* (2013.01);
(Continued)

(58) Field of Classification Search
None
See application file for complete search history.

(56) References Cited

U.S. PATENT DOCUMENTS

| 4,347,610 A | 8/1982 | Meuleman |
| 5,680,238 A | 10/1997 | Masuda |

(Continued)

FOREIGN PATENT DOCUMENTS

| JP | 56-066083 | 6/1981 |
| JP | 8-204635 | 8/1996 |

(Continued)

OTHER PUBLICATIONS

JPOA—Office Action of Japanese Patent Application No. 2015-524982 dated Oct. 18, 2016, with English translation of the relevant part, p. 1, line 20 to p. 2, line 4 and line 7 to line 19, of the Office Action.

(Continued)

*Primary Examiner* — Darren E Wolf
(74) *Attorney, Agent, or Firm* — Fujitsu Patent Center

(57) ABSTRACT

An optical transmitter includes a discrete multi-tone (DMT) modulation unit that modulates a carrier signal having a specific frequency with an information signal and a carrier signal having a frequency different from the specific frequency with a monitor signal, to generate a DMT modulation signal that multiplexes the information signal and the monitor signal. The optical transmitter includes a laser diode (LD) unit that optically converts the DMT modulation signal to a corresponding optical DMT modulation signal, a frequency extraction unit that extracts a harmonic distortion component of the monitor signal from the optical DMT modulation signal, and a frequency analysis unit. The optical transmitter includes a bias control unit that controls a bias supply unit that adjusts a bias value to be supplied to the LD unit such that the extracted harmonic distortion component of the monitor signal is reduced.

9 Claims, 16 Drawing Sheets

(51) Int. Cl.
  *H04B 10/50* (2013.01)
  *H04B 10/548* (2013.01)
  *H03F 1/32* (2006.01)
  *H04L 27/26* (2006.01)

(52) U.S. Cl.
  CPC ..... *H04B 10/504* (2013.01); *H04B 10/50572* (2013.01); *H04B 10/50575* (2013.01); *H04B 10/548* (2013.01); *H04L 27/26* (2013.01); *H04L 27/2601* (2013.01)

(56) References Cited

U.S. PATENT DOCUMENTS

| | | | |
|---|---|---|---|
| 6,456,650 | B1 | 9/2002 | Cheng et al. |
| 2003/0175037 | A1* | 9/2003 | Kimmitt ............... G02F 1/0123 398/198 |
| 2004/0131365 | A1 | 7/2004 | Lee et al. |
| 2004/0156644 | A1 | 8/2004 | Yasue et al. |
| 2004/0208614 | A1* | 10/2004 | Price ................... H04B 10/505 398/152 |

FOREIGN PATENT DOCUMENTS

| | | |
|---|---|---|
| JP | 2004-112781 | 4/2004 |
| JP | 2004-215277 | 7/2004 |
| WO | 2005/036919 | 4/2005 |

OTHER PUBLICATIONS

Fabiana Ferraro, "Study and Analysis of an Optical OFDM Based on The Discrete Hartley TransformFor IM/DD Systems", Projecte Final De Carrera, University Politecnica de Catalunya, 2010, pp. 1-80 (80 pages), URL:http://upcommons.upc.edu/pfc/bitstream/2099.1/11775/1/PFC-UPC_Ferraro.pdf.

Jeffrey, S.C. et al., "Discrete Multitone Modulation for Maximizing Transmission Rate in Step-Index Plastic Optical Fibers", Journal of Lightwave Technology, vol. 27, Issue No. 11, Jun. 1, 2009, pp. 1503-1513 (11 pages).

Lee, S.C. et al., "Discrete Multi-Tone Modulation for Low-Cost and Robust 10-Gb/s Transmission over Polymer Optical Fibre", 33rd European Conference and Exhibition of Optical Communication (ECOC), IEEE, Sep. 16, 2007, pp. 1-2 (2 pages).

International Search Report, mailed in connection with PCT/JP2013/068444, and dated Aug. 20, 2013, with English translation (4 pages).

* cited by examiner

| BIAS CURRENT [A] | OPTICAL OUTPUT POWER [W] |
|---:|---:|
| 0 | 0 |
| 0.04 | 0 |
| 0.05 | 0.002 |
| 0.06 | 0.004 |
| 0.07 | 0.006 |
| 0.08 | 0.008 |
| 0.09 | 0.01 |
| 0.1 | 0.012 |
| 0.12 | 0.016 |
| 0.14 | 0.02 |

| BIAS CURRENT [A] | RELATIVE AMOUNT OF HARMONIC DISTORTION [dB] |
|---|---|
| 0.04 | -11.5 |
| 0.05 | -14.3 |
| 0.06 | -18.2 |
| 0.07 | -25.0 |
| 0.08 | -77.6 |
| 0.09 | -76.4 |
| 0.1 | -75.9 |
| 0.12 | -74.9 |
| 0.14 | -74.0 |

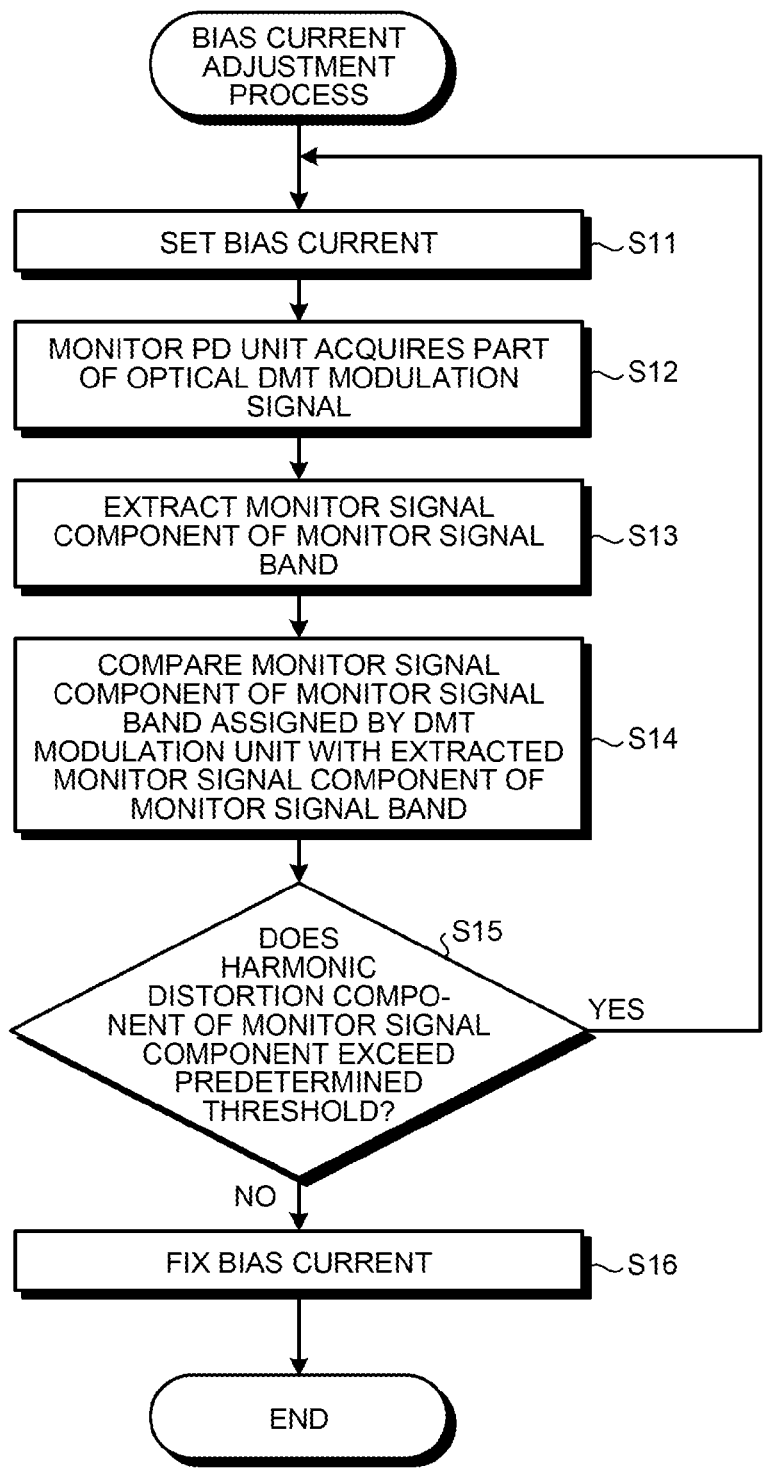

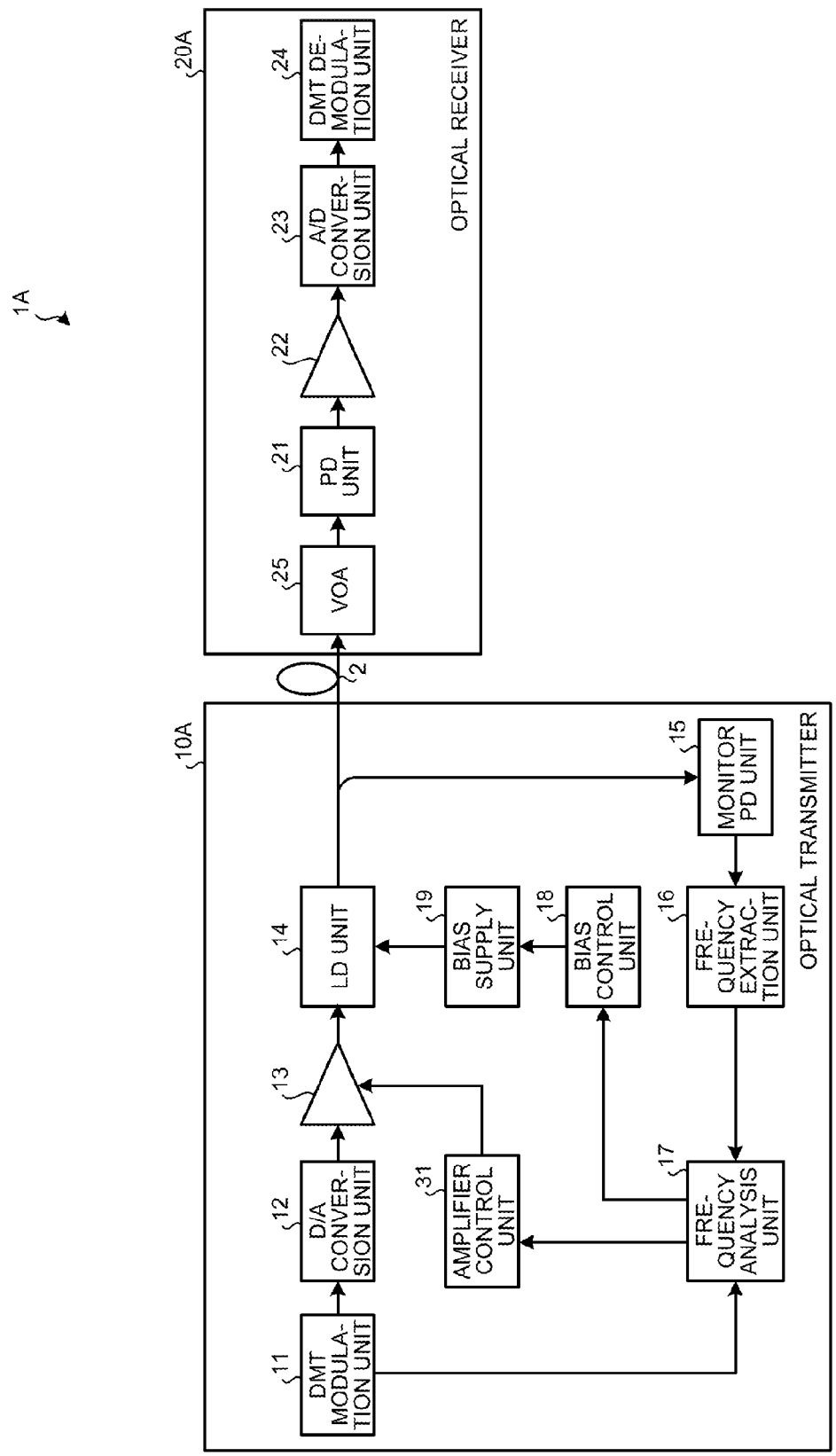

OPTICAL SIGNAL PROCESSING APPARATUS, OPTICAL SIGNAL PROCESSING METHOD, AND RECORDING MEDIUM

CROSS-REFERENCE TO RELATED APPLICATION

This application is a continuation of International Application No. PCT/JP2013/068444, filed on Jul. 4, 2013, the entire contents of which are incorporated herein by reference.

FIELD

The embodiments discussed herein are related to an optical signal processing apparatus, an optical signal processing method, and a recording medium.

BACKGROUND

The multicarrier modulation scheme is known including, for example, the discrete multi-tone (DMT) modulation scheme that modulates a plurality of carrier signals having different frequencies using an information signal to thereby frequency-multiplex a plurality of information signals. The DMT modulation scheme divides a use band into subchannels to thereby modulate frequency channels (subcarriers) through quadrature amplitude modulation (QAM). The DMT modulation scheme allows the number of bits used to transmit the information signals and assigned to each frequency to be varied according to a signal-to-noise (S/N) ratio. The DMT modulation scheme thus can transmit a large volume of information in a manner of making effective use of the use frequency.

The multicarrier modulation scheme, however, involves nonlinear distortion such as harmonic distortion occurring in each carrier signal to be modulated with the information signal and thus a need exists for a technique that reduces the nonlinear distortion in each carrier signal.

A known technique, although not in the field of the multicarrier modulation scheme, reduces the nonlinear distortion of an optical signal by superimposing a low-frequency signal over the optical signal. Incorporating this technique, however, requires a circuit used for superimposing the low-frequency signal over each carrier signal, thus resulting in a complicated circuit configuration.

SUMMARY

According to an aspect of an embodiment, an optical signal processing apparatus includes a modulation unit, an extraction unit and a control unit. The modulation unit modulates a carrier signal having a specific frequency with an information signal and a carrier signal having a frequency different from the specific frequency with a monitor signal, to generate a multicarrier modulation signal that multiplexes the information signal and the monitor signal. The extraction unit extracts a distortion component of the monitor signal from the multicarrier modulation signal modulated by the modulation unit. The control unit controls an adjustment unit that adjusts the multicarrier modulation signal such that the distortion component of the monitor signal extracted by the extraction unit is reduced.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is an example flowchart illustrating operations performed by an optical transmitter, relating to a bias current adjustment process;

FIG. 8 is an example block diagram illustrating an optical transmission system according to a second embodiment;

DESCRIPTION OF EMBODIMENTS

Preferred embodiments of the present invention will be explained with reference to accompanying drawings. It is to be understood that these embodiments are not restrictive of the disclosed technique, as claimed.

[a] First Embodiment

Figure 1:
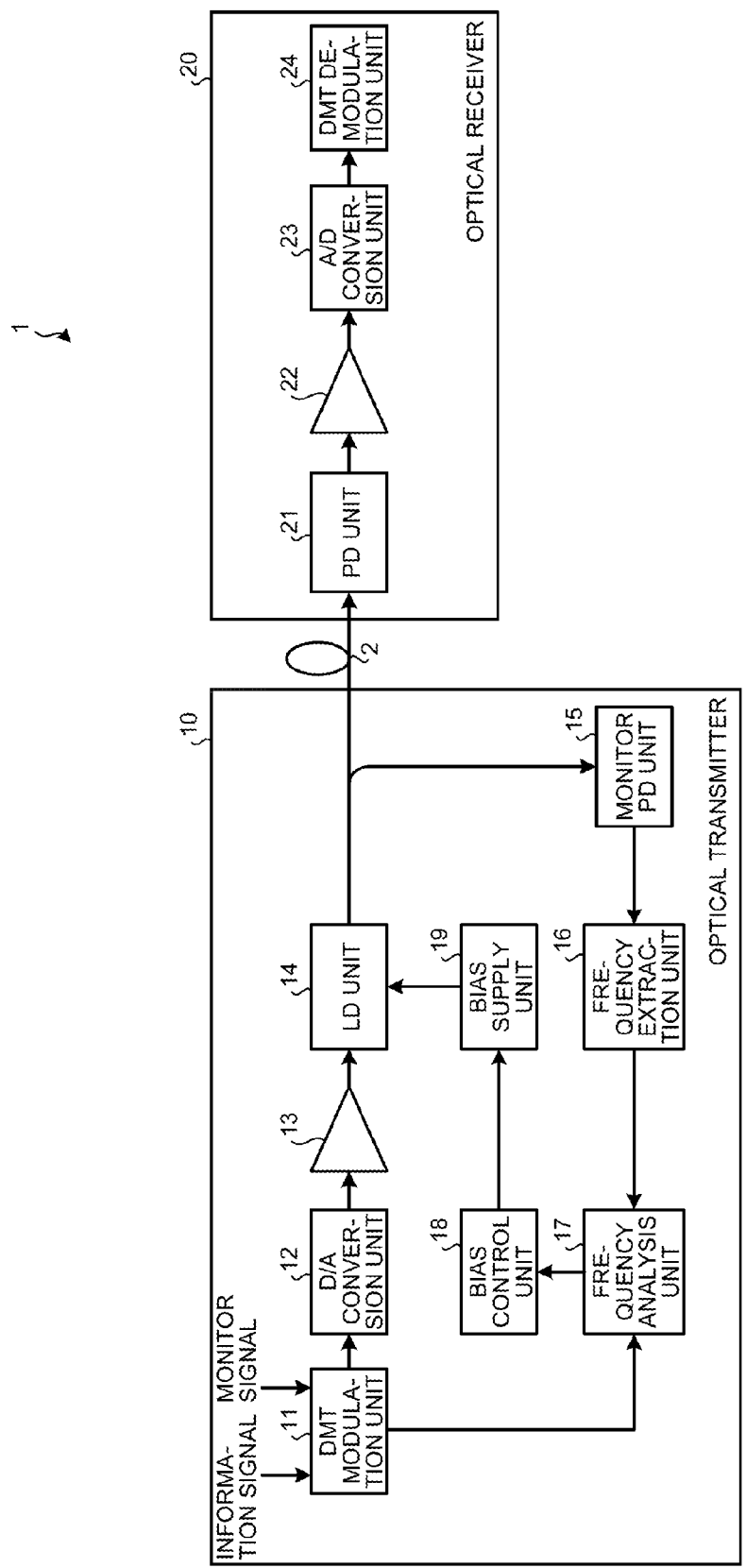
FIG. 1 is an example block diagram illustrating an optical transmission system according to a first embodiment.

FIG. 1 is an example block diagram illustrating an optical transmission system according to a first embodiment. This optical transmission system 1 illustrated in FIG. 1 includes an optical transmitter 10, an optical receiver 20, and an optical transmission path 2 that connects the optical transmitter 10 to the optical receiver 20. The optical transmitter 10 includes a DMT modulation unit 11, a digital-to-analog (D/A) conversion unit 12, an amplifier unit 13, a laser diode (LD) unit 14, a monitor photo detector (PD) unit 15, a frequency extraction unit 16, a frequency analysis unit 17, a bias control unit 18, and a bias supply unit 19.

The DMT modulation unit 11 modulates an information signal for each of carrier signals on channels having different specific frequencies. The DMT modulation unit 11 further modulates a monitor signal for each of the carrier signals on the channels having different specific frequencies. Thereby, the DMT modulation unit 11 generates a DMT modulation signal that multiplexes the information signals and monitor signals over carrier waves.

Figure 2:
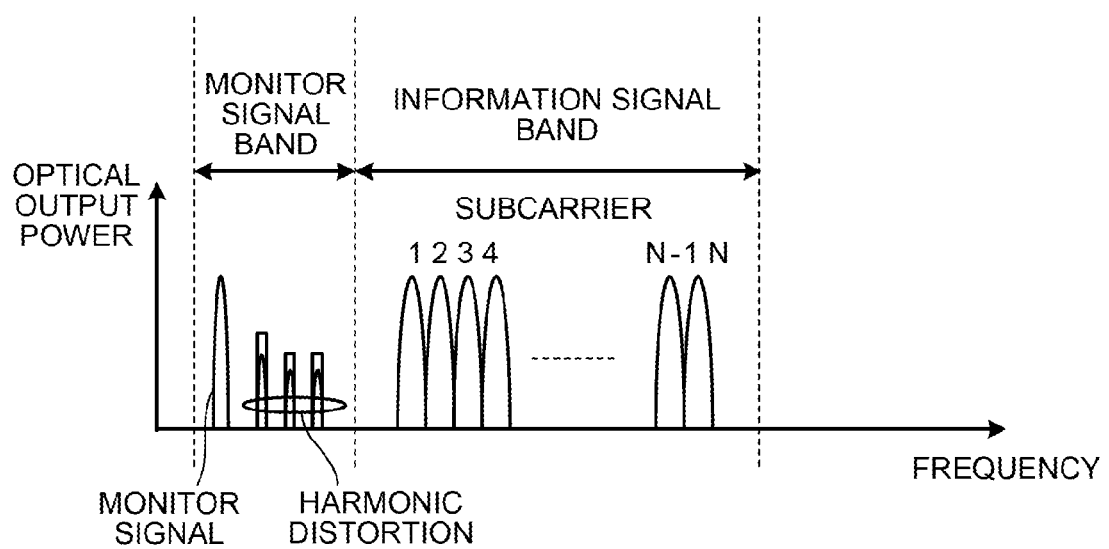
FIG. 2 is an example diagram illustrating a frequency spectrum of an optical DMT modulation signal.

The D/A conversion unit 12 converts the DMT modulation signal to a corresponding analog signal. The amplifier unit 13 amplifies the analog DMT modulation signal. The LD unit 14 converts optically the amplified DMT modulation signal into an optical DMT modulation signal and transmits the optical DMT modulation signal to the optical transmission path 2. The LD unit 14 has an LD characteristic that corresponds, for example, to a ratio of optical output power to bias current, fluctuating depending on, for example, an ambient temperature or an elapsed time of use. FIG. 2 is an example diagram illustrating a frequency spectrum of the optical DMT modulation signal. The optical DMT modulation signal has an information signal band and a monitor signal band. The information signal band represents a frequency band for subcarrier channels that carry the information signals. The monitor signal band represents a frequency band for channels that carry the monitor signals. The frequency band used by the optical DMT modulation signal is, for example, several GHz and the frequency band of each of channels 1 to N of each subcarrier of the information signal band is several tens of MHz. When the LD unit 14 optically converts the DMT modulation signal to the optical DMT modulation signal, a harmonic distortion component of the monitor signal may be generated in the monitor signal band of the optical DMT modulation signal as illustrated in FIG. 2.

The monitor PD unit 15 receives part of the optical DMT modulation signal optically converted by the LD unit 14 and electrically converts the received optical DMT modulation signal to a corresponding DMT modulation signal. The frequency extraction unit 16 extracts a monitor signal component of the monitor signal band of the DMT modulation signal. The frequency extraction unit 16 may, for example, be a low pass filter (LPF) that can extract the monitor signal component of the monitor signal band on a lower frequency side than the information signal band of the DMT modulation signal. The frequency analysis unit 17 performs frequency analysis of the monitor signal component of the monitor signal band extracted by the frequency extraction unit 16 to thereby extract the harmonic distortion component of the monitor signal. A narrow bandwidth band-pass filter (BPF) may be employed to extract and control the harmonic distortion component of the monitor signal.

The bias supply unit 19 supplies the LD unit 14 with a bias current as a drive current. The bias control unit 18 controls the bias supply unit 19 in accordance with an analysis of the frequency analysis unit 17. The bias control unit 18 controls the bias supply unit 19 on the basis of the harmonic distortion component of the monitor signal extracted by the frequency analysis unit 17, thereby adjusting a bias current amount so as to reduce the harmonic distortion component of the monitor signal band of the optical DMT modulation signal.

The optical receiver 20 includes a PD unit 21, an amplifier unit 22, an analog-to-digital (A/D) conversion unit 23, and a DMT demodulation unit 24. The PD unit 21 electrically converts the optical DMT modulation signal received from the optical transmission path 2 to a corresponding DMT modulation signal. The amplifier unit 22 amplifies the electrically converted DMT modulation signal. The A/D conversion unit 23 digitally converts the electrically converted DMT modulation signal. The DMT demodulation unit 24 demodulates the digitally converted DMT modulation signal, thereby acquiring an information signal of the information signal band of the DMT modulation signal.

Figures 3A, 3B:
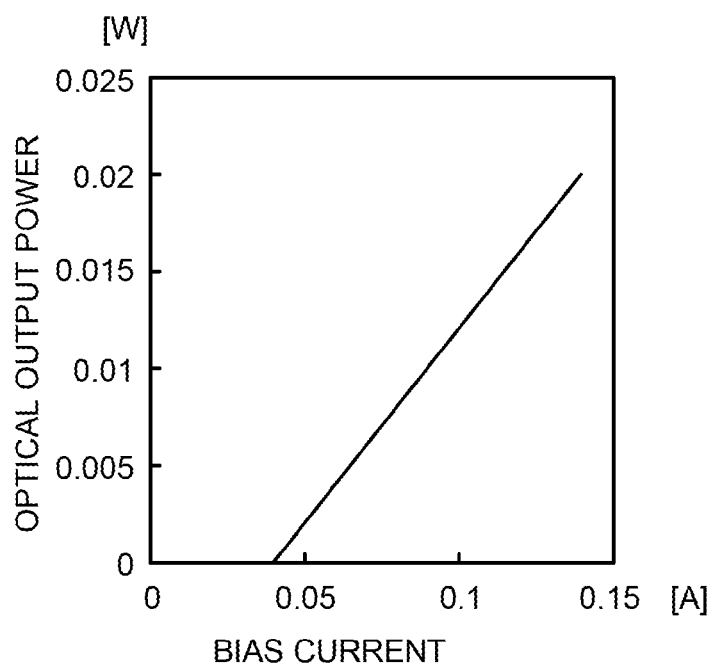
FIG. 3A is an example table illustrating a relation between a bias current amount and optical output power of the optical DMT modulation signal.
FIG. 3B is an example graph illustrating a characteristic between the bias current amount and the optical output power.

The bias control unit 18 of the optical transmitter 10 controls the bias supply unit 19 to thereby adjust a bias current amount to be supplied to the LD unit 14. As a result, the LD unit 14 optically converts and outputs the optical DMT modulation signal having optical output power corresponding to the bias current from the bias supply unit 19. FIG. 3A is an example table illustrating a relation between the bias current amount and the optical output power of the optical DMT modulation signal. FIG. 3B is an example graph illustrating a characteristic between the bias current amount and the optical output power. Additionally, it is assumed that, for example, the modulation frequency of the DMT modulation signal is 0.009766 GHz, threshold current is 0.04 A, and drive amplitude is 0.12 A. The threshold current represents a minimum bias current with which the LD unit 14 can optically output the optical DMT modulation signal. FIGS. 3A and 3B illustrate that the optical output power of the optical DMT modulation signal increases with an increase in bias current over 0.04 A.

Figures 4A, 4B:
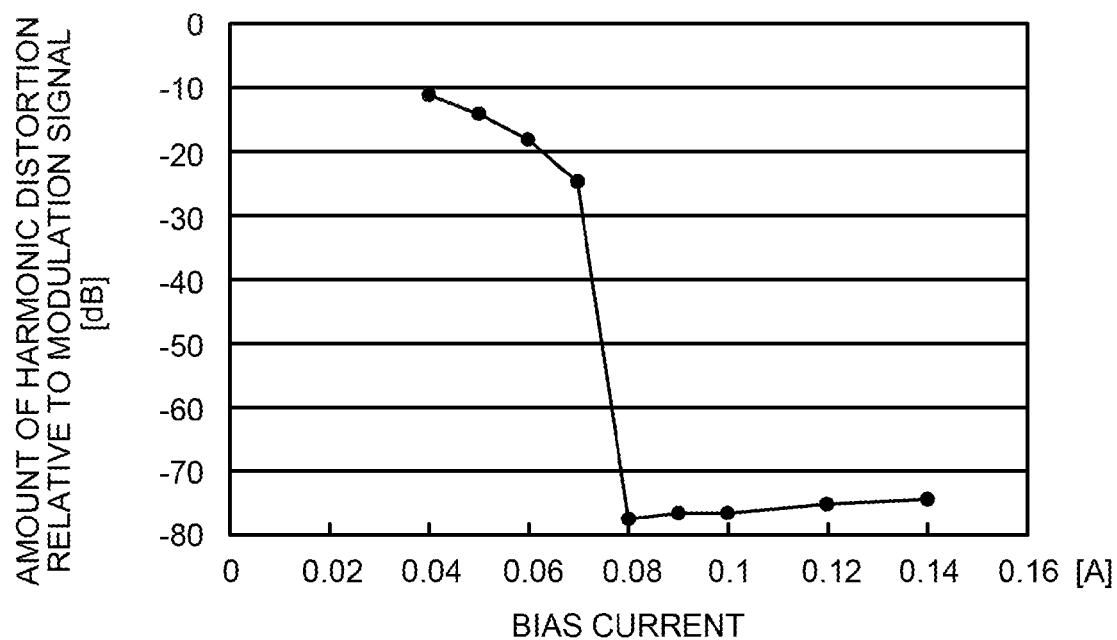
FIG. 4A is an example table illustrating a relation between the bias current amount and an amount of a harmonic distortion component relative to a monitor signal of the optical DMT modulation signal.
FIG. 4B is an example graph illustrating a characteristic between the bias current amount and the relative amount of the harmonic distortion component.

FIG. 4A is an example table illustrating a relation between the bias current amount and an amount of the harmonic distortion component relative to the monitor signal of the optical DMT modulation signal. FIG. 4B is an example graph illustrating a characteristic between the bias current amount and the relative amount of the harmonic distortion component. It is noted that the amount of the harmonic distortion component relative to the monitor signal of the optical DMT modulation signal is, for example, a sum of the first-order harmonic distortion component to the fourth-order harmonic distortion component of the monitor signal. For example, in FIG. 4A, when the bias current is 0.04 A, the relative amount of the harmonic distortion component is −11.5 dB and when the bias current is 0.05 A, the relative amount of the harmonic distortion component is −14.3 dB. Similarly, when the bias current is 0.06 A, the relative amount of the harmonic distortion component is −18.2 dB and when the bias current is 0.07 A, the relative amount of the harmonic distortion component is −25.0 dB. Specifically, in FIG. 4B, when the bias current ranges between 0.04 A and 0.07 A, for example, the amount of the harmonic distortion component relative to the optical DMT modulation signal increases.

In contrast, when the bias current is 0.08 A, the relative amount of the harmonic distortion component is −77.6 dB and when the bias current is 0.09 A, the relative amount of the harmonic distortion component is −76.4 dB. Specifically, as illustrated in FIG. 4B, the amount of the harmonic distortion component relative to the optical DMT modulation signal decreases when the bias current exceeds 0.08 A.

Figure 5A:
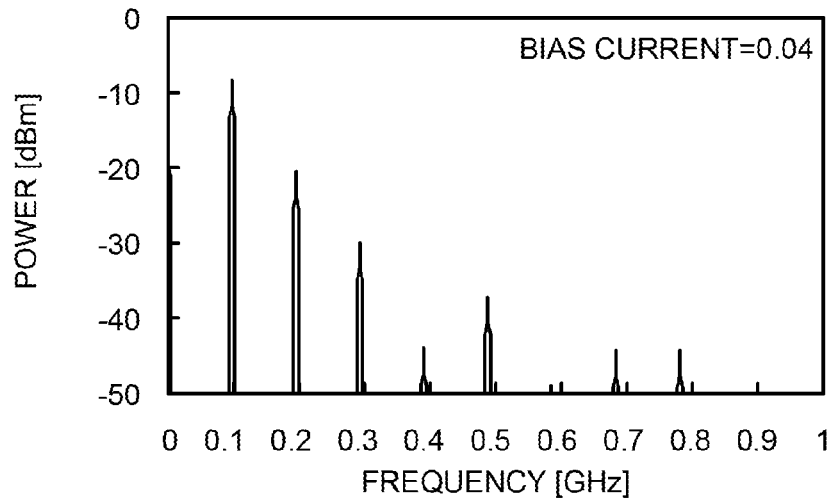
FIG. 5A is an example graph illustrating optical output of a harmonic distortion component for a specific bias current amount.
Figure 5B:
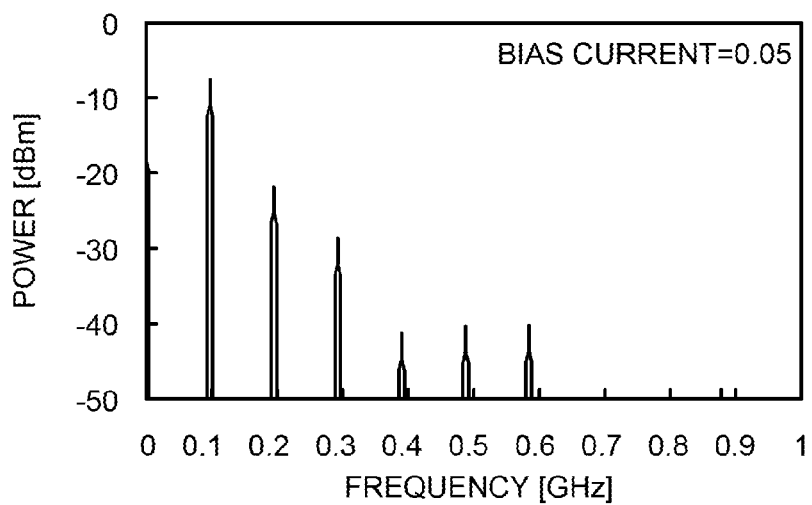
FIG. 5B is an example graph illustrating optical output of a harmonic distortion component for a specific bias current amount.
Figure 5C:
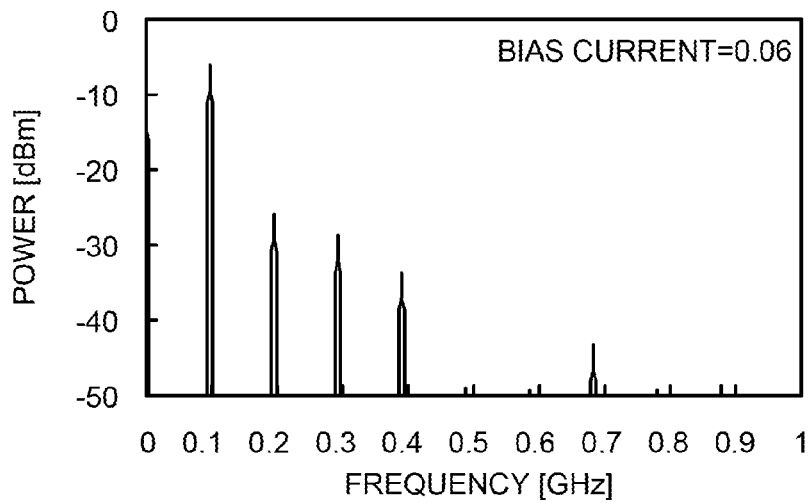
FIG. 5C is an example graph illustrating optical output of a harmonic distortion component for a specific bias current amount.

FIGS. 5A, 5B, 5C, 6A, 6B, and 6C are example graphs each illustrating optical output of a harmonic distortion component for a specific bias current amount. FIGS. 5A to 6C represent example calculations of the optical output of different harmonic distortion components when the LD unit 14 modulates a sine wave of 98 MHz. For example, in FIG. 5A, when the bias current is 0.04 A, high harmonic distortion components occur in the frequency bands of 0.2 GHz, 0.3 GHz, 0.4 GHz, 0.5 GHz, 0.7 GHz, and 0.8 GHz with respect to the monitor signal of 0.1 GHz. In FIG. 5B, when the bias current is 0.05 A, for example, high harmonic distortion components occur in the frequency bands of 0.2 GHz, 0.3 GHz, 0.4 GHz, 0.5 GHz, and 0.6 GHz with respect to the monitor signal of 0.1 GHz. Additionally, in FIG. 5C, when the bias current is 0.06 A, for example, high harmonic distortion components occur in the frequency bands of 0.2 GHz, 0.3 GHz, 0.4 GHz, and 0.7 GHz with respect to the monitor signal of 0.1 GHz.

Figure 6A:
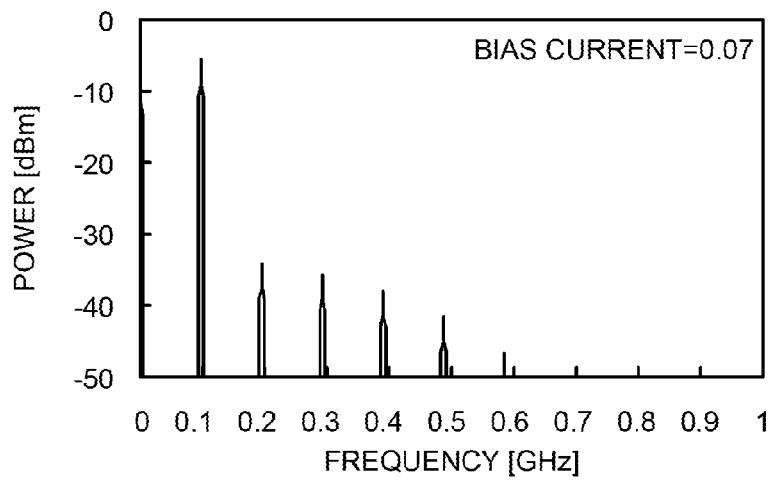
FIG. 6A is an example graph illustrating optical output of a harmonic distortion component for a specific bias current amount.

In FIG. 6A, when the bias current is 0.07 A, for example, high harmonic distortion components occur in the frequency bands of 0.2 GHz, 0.3 GHz, 0.4 GHz, 0.5 GHz, and 0.6 GHz with respect to the monitor signal of 0.1 GHz.

Figure 6B:
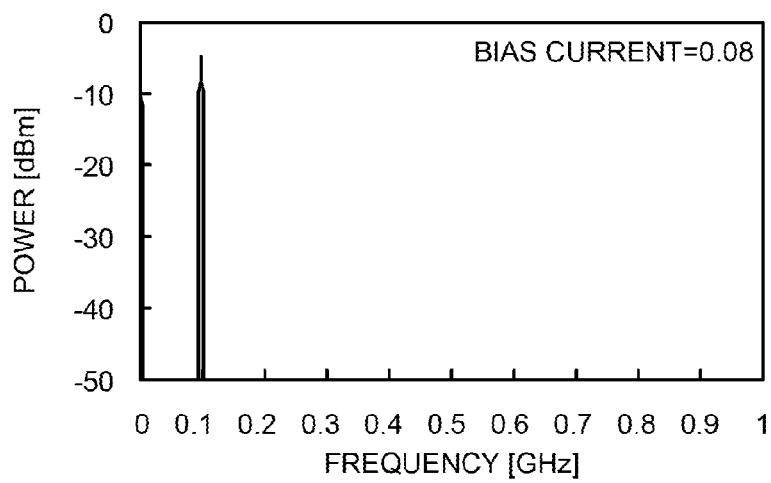
FIG. 6B is an example graph illustrating optical output of a harmonic distortion component for a specific bias current amount.
Figure 6C:
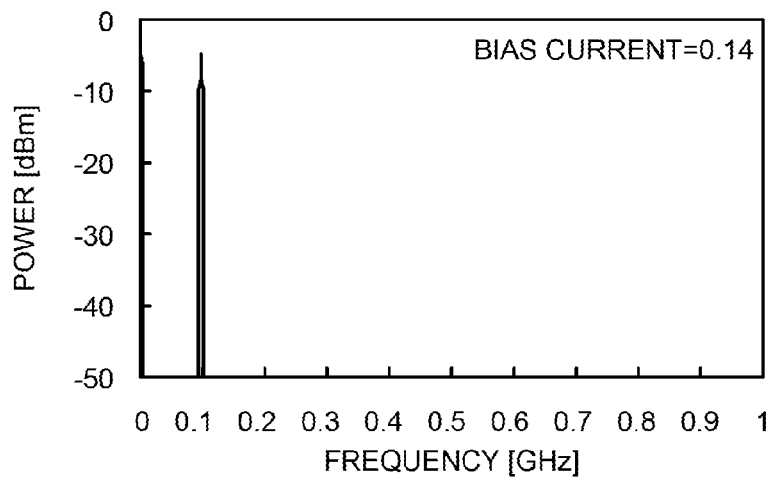
FIG. 6C is an example graph illustrating optical output of a harmonic distortion component for a specific bias current amount.

In FIG. 6B, however, when the bias current is 0.08 A, the harmonic distortion component is reduced with respect to the monitor signal of 0.1 GHz. Similarly, in FIG. 6C, when the bias current is 0.14 A, the harmonic distortion component is reduced with respect to the monitor signal of 0.1 GHz. Specifically, with the bias current exceeding 0.08 A, for example, the harmonic distortion component is reduced with respect to the monitor signal of 0.1 GHz.

The bias control unit 18 extracts the harmonic distortion component of the monitor signal that represents the result of the comparison made by the frequency analysis unit 17 of the monitor signal component and determines whether the harmonic distortion component exceeds a predetermined threshold. The predetermined threshold is a value that is permissible to the extent that a total amount of the harmonic distortion components relative to the information signal does not affect transmission of the information signal. The total amount of the harmonic distortion components relative to the information signal corresponds to, for example, the total amount of the first-order harmonic distortion component to the fourth-order harmonic distortion component of the monitor signal. It is noted that the predetermined threshold is compared, for convenience sake, with the total relative amount that represents the sum of the amounts of the first-order harmonic distortion component to the fourth-order harmonic distortion component. The comparison may nonetheless be made for the harmonic distortion component of each order, such as for the first-order harmonic distortion component, the second-order harmonic distortion component, and the like.

The bias control unit 18 controls the bias supply unit 19 on the basis of the characteristic that indicates the relation between the bias current amount for the LD unit 14 and the harmonic distortion component with respect to the monitor signal, to thereby adjust the bias current amount to be supplied to the LD unit 14. Specifically, the harmonic distortion component of the monitor signal of the optical DMT modulation signal is proportional to the harmonic distortion component of the information signal of the optical DMT modulation signal. Thus, by adjusting the bias current amount to be supplied to the LD unit 14, the bias control unit 18 reduces not only the harmonic distortion component of the monitor signal of the optical DMT modulation signal, but also the harmonic distortion component of the information signal of the optical DMT modulation signal.

The following describes operations of the optical transmitter 10 in the first embodiment. FIG. 7 is an example flowchart illustrating operations performed by the optical transmitter 10 relating to a bias current adjustment process. The bias current adjustment process illustrated in FIG. 7 extracts the harmonic distortion component of the monitor signal component of the optical DMT modulation signal and, when the extracted harmonic distortion component exceeds the predetermined threshold, adjusts the bias current amount to be supplied to the LD unit 14 so as to reduce the harmonic distortion component.

In FIG. 7, the bias control unit 18 of the optical transmitter 10 sets the bias current amount to be supplied to the LD unit 14 (Step S11). The monitor PD unit 15 of the optical transmitter 10 acquires part of the optical DMT modulation signal as the output from the LD unit 14 (Step S12). The frequency extraction unit 16 of the optical transmitter 10 extracts the monitor signal component of the monitor signal band of the acquired optical DMT modulation signal (Step S13).

The frequency analysis unit 17 of the optical transmitter 10 compares the monitor signal component extracted by the frequency extraction unit 16 with the monitor signal component of the monitor signal band modulated by the DMT modulation unit 11 (Step S14). Thus, the frequency analysis unit 17 acquires the harmonic distortion component of the monitor signal component on the basis of the result of comparison of the monitor signal components. The bias control unit 18 determines whether the harmonic distortion component based on the comparison of the monitor signal components exceeds the predetermined threshold (Step S15).

When the harmonic distortion component of the monitor signal component exceeds the predetermined threshold (Yes at Step S15), the bias control unit 18 performs Step S11 in order to set the bias current amount in a direction in which the harmonic distortion component of the monitor signal component is reduced. When the harmonic distortion component of the monitor signal component exceeds the predetermined threshold, the bias control unit 18 can assume that the harmonic distortion component of the information signal component of the optical DMT modulation signal exists. The bias control unit 18 adjusts the bias current amount to be supplied to the LD unit 14 in the direction in which the harmonic distortion component of the monitor signal component is reduced. The bias control unit 18 reduces not only the harmonic distortion component with respect to the monitor signal component of the optical DMT modulation signal, but also the harmonic distortion component with respect to the information signal component of the optical DMT modulation signal. Nonlinear distortion of the optical DMT modulation signal can be reduced.

When the harmonic distortion component of the monitor signal component does not exceed the predetermined threshold (No at Step S15), the bias control unit 18 determines the bias current amount set at Step S11 to be the bias current amount to be supplied to the LD unit 14 (Step S16) and the bias current adjustment process illustrated in FIG. 7 is terminated. It is noted that, when the harmonic distortion component of the monitor signal does not exceed the predetermined threshold, the bias control unit 18 can assume that the harmonic distortion component of the information signal component of the optical DMT modulation signal is so small as not to affect the transmission.

The optical transmitter 10 that performs the bias current adjustment process extracts the harmonic distortion component of the monitor signal component from part of the optical DMT modulation signal and, when the extracted harmonic distortion component exceeds the predetermined threshold, adjusts the bias current amount to be supplied to the LD unit 14 in the direction in which the harmonic distortion component is reduced. As a result, the optical transmitter 10 can reduce the harmonic distortion component with respect to the information signal component of the DMT modulation signal by reducing the harmonic distortion component with respect to the monitor signal component. The nonlinear distortion of the optical DMT modulation signal can be reduced.

The optical transmitter 10 in the first embodiment extracts the harmonic distortion component of the monitor signal component from part of the optical DMT modulation signal and, when the extracted harmonic distortion component exceeds the predetermined threshold, adjusts the bias current amount to be supplied to the LD unit 14 in the direction in which the harmonic distortion component is reduced. As a result, the optical transmitter 10 can reduce the harmonic distortion component with respect to the information signal component of the optical DMT modulation signal by reducing the harmonic distortion component of the monitor signal component. The reduction in the nonlinear distortion of the optical DMT modulation signal reduces degradation of the S/N ratio caused by the nonlinear distortion. This advantageous effect increases a multi-value degree of the information signal assigned to each channel to thereby achieve greater transmission capacity.

With the DMT modulation signal that has undergone digital signal processing, the optical transmitter 10 can reduce degradation of transmission quality for its ability to reduce the nonlinear distortion of the optical DMT modulation signal when an analog waveform is distorted by nonlinearity of the LD unit 14, although the distortion greatly degrades the transmission quality.

The optical transmitter 10 in the first embodiment causes the DMT modulation unit 11 to multiplex the monitor signal to the lower frequency side of the frequency band of the information signal. Thus, because the monitor signal is in the low-frequency band, a monitor signal bandwidth can also be narrowed for monitoring the harmonic distortion component with respect to the monitor signal.

It is noted that, in the first embodiment described above, the DMT modulation unit 11 multiplexes the monitor signal to the lower frequency side of the frequency band of the information signal. The monitor signal may be multiplexed to the higher frequency side of the frequency band of the information signal. In this case, because of the monitor signal in the high-frequency band, the distortion of high-frequency devices such as the amplifier unit 13 and the LD unit 14 tends to occur on the higher frequency side. This trend improves accuracy in monitoring the harmonic distortion component with respect to the monitor signal.

In the first embodiment described above, the frequency analysis unit 17 extracts the harmonic distortion component with respect to the monitor signal of the optical DMT modulation signal. Intermodulation distortion may nonetheless be extracted. The bias control unit 18 controls the bias supply unit 19 on the basis of the extracted intermodulation distortion in order to adjust the bias current amount so as to reduce the intermodulation distortion of the monitor signal band of the optical DMT modulation signal. The optical transmitter 10 can, as a result, reduce mutual distortion of the information signal component of the optical DMT modulation signal by reducing mutual distortion of the monitor signal component.

In the first embodiment described above, the multi-value degree of the information signal band of the DMT modulation signal is preferably set high. The multi-value degree of channels of the monitor signal band may nonetheless be low.

In the first embodiment described above, an LPF is exemplarily used for the frequency extraction unit 16. When the monitor signal band exists on the higher frequency side of the information signal band of the optical DMT modulation signal, however, the monitor signal component of the monitor signal band may be extracted using an LPF following downconversion using, for example, a narrow-bandwidth mixer. Alternatively, the monitor signal may be first donwconverted to the monitor signal band disposed on the higher frequency side and the monitor signal component of the monitor signal band may then be extracted using a low-frequency D/A conversion circuit. Still alternatively, the harmonic component of the monitor signal may be extracted using a narrow-bandwidth band pass filter (BPF) for use in the control.

While the DMT modulation signal is directly modulated by the LD unit 14 in the first embodiment described above, a modulator of an external modulation scheme may, for example, be employed in which a DMT modulation signal that multiplexes a monitor signal and an information signal is optically converted to a corresponding optical DMT modulation signal. Non-limiting examples of the modulator of the external modulation scheme include an electronic absorption (EA) modulator and a LiNbO3 (LN) modulator. The EA modulator and the LN modulator have, for example, a region in which distortion in a linear region occurs depending on the bias current amount and modulation amplitude. When the EA modulator or the LN modulator optically converts the DMT modulation signal that multiplexes the monitor signal and the information signal to a corresponding optical DMT modulation signal, therefore, the bias control unit 18 extracts the harmonic distortion component of the monitor signal component from part of the optical DMT modulation signal thus optically converted by the modulator. When the extracted harmonic distortion component exceeds a predetermined threshold, the bias control unit 18 further adjusts the bias current to be supplied to the EA modulator or the LN modulator in a direction in which the harmonic distortion component is reduced. The bias current to be supplied to the EA modulator or the LN modulator can thereby be adjusted, so that the harmonic distortion component with respect to the information signal component of the optical DMT modulation signal can be reduced.

While the first embodiment described above has been exemplified by the optical transmitter 10 according to the DMT modulation scheme, the present invention can still be applied to an optical transmitter of the multicarrier modulation scheme that multiplexes the information signal with a plurality of subcarrier signals. Examples of the multicarrier modulation scheme include the orthogonal frequency division multiplexing (OFDM) modulation scheme and various types of phase shift keying (PSK) modulation schemes including the quadrature phase shift keying (QPSK) modulation scheme. The present invention is likewise applicable to differential phase shift keying (DPSK) and 8PSK.

While the first embodiment has been described to include the optical transmitter 10 and the optical receiver 20 as individual elements separated from each other, an embodiment is still possible in which a single optical module includes the optical transmitter 10 and the optical receiver 20 built therein.

The optical transmitter 10 in the first embodiment described above extracts the harmonic distortion component of the monitor signal component and, when the extracted harmonic distortion component exceeds the predetermined threshold, adjusts the bias current amount to be supplied to the LD unit 14 in the direction in which the harmonic distortion component is reduced. The optical transmitter 10 may nonetheless adjust an amount of gain of the amplifier unit 13 in the direction in which the harmonic distortion component is reduced, in addition to the bias current amount of the LD unit 14. The following describes a second embodiment in which the gain amount of the amplifier unit is adjusted.

[b] Second Embodiment

FIG. 8 is an example block diagram illustrating an optical transmission system according to a second embodiment. In the second embodiment, like or corresponding elements are identified by the same reference numerals as those used for the elements described with reference to the first embodiment and descriptions for arrangements and operations of those elements will not be duplicated. This optical transmission system 1A illustrated in FIG. 8 includes an optical transmitter 10A and an optical receiver 20A. The optical transmitter 10A includes a DMT modulation unit 11, a D/A conversion unit 12, an amplifier unit 13, an LD unit 14, a monitor PD unit 15, a frequency extraction unit 16, a frequency analysis unit 17, a bias control unit 18, and a bias supply unit 19. The optical transmitter 10A further includes an amplifier control unit 31 that adjusts the amount of gain of the amplifier unit 13, in addition to the foregoing elements. The amplifier control unit 31 adjusts the gain amount of the amplifier unit 13. The optical receiver 20A includes a VOA 25 that is disposed at a stage before the PD unit 21 and that attenuates an optical DMT modulation signal received from an optical transmission path 2, in addition to a PD unit 21, an amplifier unit 22, an A/D conversion unit 23, and a DMT demodulation unit 24.

The optical transmitter 10A causes the bias control unit 18 to adjust the bias current amount of the LD unit 14 and causes the amplifier control unit 31 to adjust the gain amount of the amplifier unit 13. The frequency analysis unit 17 compares the monitor signal component extracted by the frequency extraction unit 16 with the monitor signal component modulated by the DMT modulation unit 11 and, on the basis of the result of the comparison, acquires the harmonic distortion component of the monitor signal component.

Figure 9:
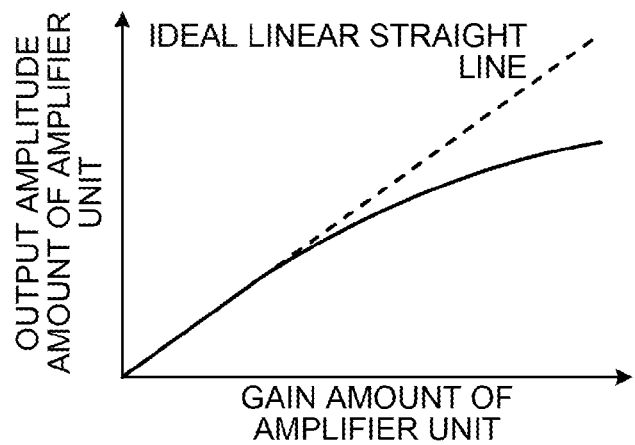
FIG. 9 is an example graph illustrating a characteristic between an output amplitude amount and a gain amount of an amplifier unit.
Figure 10:
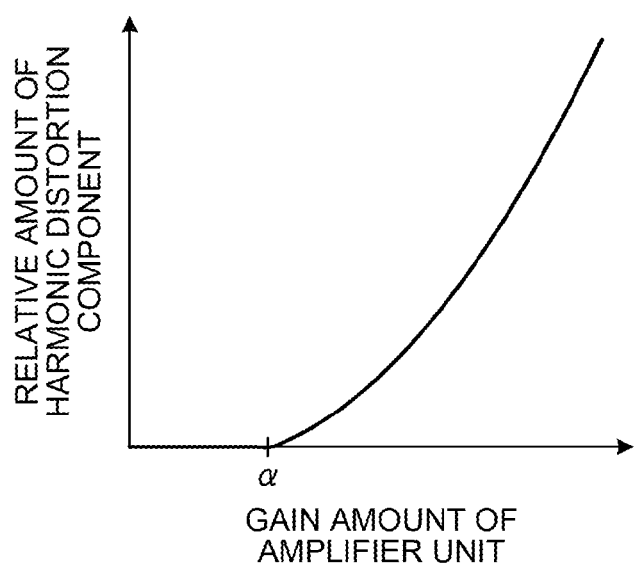
FIG. 10 is an example graph illustrating a relation between a gain amount of the amplifier unit and a relative amount of the harmonic distortion component with respect to the monitor signal of the optical DMT modulation signal.

FIG. 9 is an example graph illustrating a characteristic between an output amplitude amount and the gain amount of the amplifier unit 13. Ideally, the output amplitude amount illustrated in FIG. 9 increases linearly with an increasing gain amount of the amplifier unit 13. The output amplitude amount after a predetermined threshold is, however, saturated even with an increasing gain amount of the amplifier unit 13. FIG. 10 is an example graph illustrating a characteristic between the gain amount of the amplifier unit 13 and a relative amount of the harmonic distortion component with respect to the monitor signal of the optical DMT modulation signal. The relative amount of the harmonic distortion component illustrated in FIG. 10 increases sharply when the gain amount of the amplifier unit 13 exceeds a predetermined threshold.

The amplifier control unit 31 determines whether the harmonic distortion component of the monitor signal component acquired by the frequency analysis unit 17 exceeds a predetermined threshold. When the harmonic distortion component of the monitor signal component exceeds the predetermined threshold, the amplifier control unit 31 adjusts the gain amount of the amplifier unit 13 in a direction in which the harmonic distortion component of the monitor signal component is reduced. When the harmonic distortion component of the monitor signal component exceeds the predetermined threshold, the amplifier control unit 31 can assume that the information signal component of the DMT demodulation signal contains a harmonic distortion component. The amplifier control unit 31 thus adjusts the gain amount of the amplifier unit 13 in a direction in which the harmonic distortion component of the monitor signal component is reduced, specifically, the gain amount illustrated in FIG. 10 is equal to or less than a. The amplifier control unit 31 can reduce not only the harmonic distortion component of the monitor signal component of the optical DMT modulation signal, but also the harmonic distortion component with respect to the information signal component of the optical DMT modulation signal. Nonlinear distortion of the optical DMT modulation signal can even be reduced.

When the harmonic distortion component of the monitor signal component does not exceed the predetermined threshold, the amplifier control unit 31 fixes a set gain amount of the amplifier unit 13. It is noted that, when the harmonic distortion component of the monitor signal does not exceed the predetermined threshold, the amplifier control unit 31 can assume that the harmonic distortion component of the information signal component of the optical DMT modulation signal is so small as not to affect the transmission.

When the harmonic distortion component of the monitor signal component acquired from part of the optical DMT modulation signal exceeds the predetermined threshold, the amplifier control unit 31 of the optical transmitter 10A in the second embodiment adjusts the gain amount of the amplifier unit 13 in the direction in which the harmonic distortion component is reduced. When the harmonic distortion component of the monitor signal component exceeds the predetermined threshold, the optical transmitter 10A adjusts the bias current amount of the LD unit 14 in the direction in which the harmonic distortion component is reduced. The optical transmitter 10A thus can reduce the harmonic distortion component of the monitor signal component and the harmonic distortion component of the information signal component by adjusting not only the bias current amount of the LD unit 14, but also the gain amount of the amplifier unit 13.

For convenience sake, the optical receiver 20A illustrated in FIG. 8 has been exemplarily described to include the amplifier unit 22 and the VOA 25 built therein. The amplifier unit 22 and the VOA 25 do not, however, have to be built in the optical receiver 20A. Additionally, the optical transmitter 10 in the first embodiment described previously extracts the harmonic distortion component of the monitor signal component from part of the optical DMT modulation signal as the output from the LD unit 14. The harmonic distortion component of the monitor signal component may nonetheless be extracted using, instead of the optical transmitter 10, the optical receiver 20 that receives the optical DMT modulation signal from the optical transmitter 10 via the optical transmission path 2. The following describes a third embodiment in which the harmonic distortion component of the monitor signal component is extracted by the optical receiver that receives the optical DMT modulation signal from the optical transmitter via the optical transmission path.

[c] Third Embodiment

Figure 11:
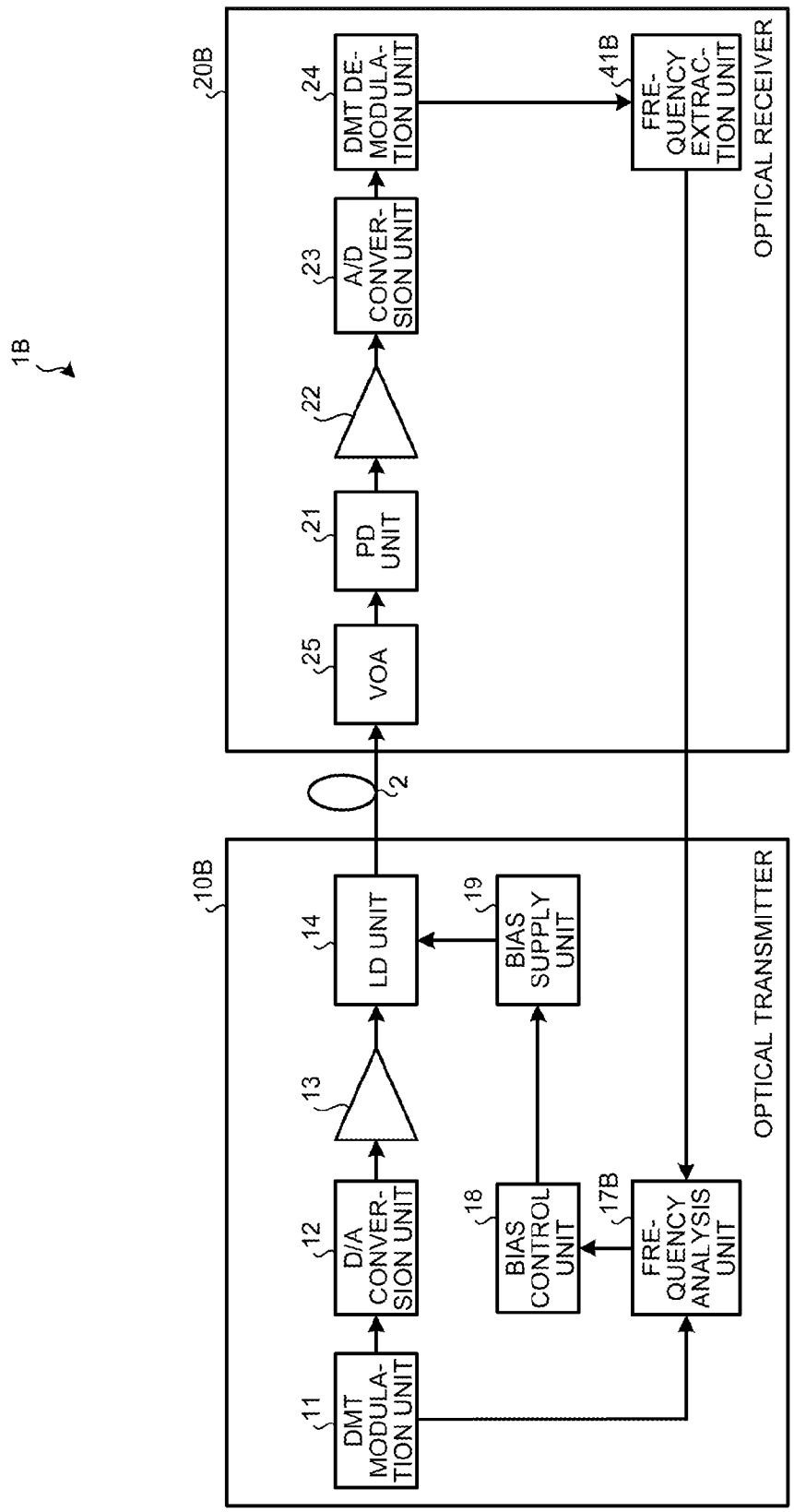
FIG. 11 is an example block diagram illustrating an optical transmission system according to a third embodiment.

FIG. 11 is an example block diagram illustrating an optical transmission system according to a third embodiment. In the third embodiment, like or corresponding elements are identified by the same reference numerals as those used for the elements described with reference to the first embodiment and descriptions for arrangements and operations of those elements will not be duplicated. This optical transmission system 1B illustrated in FIG. 11 includes an optical transmitter 10B and an optical receiver 20B. The optical receiver 20B includes a VOA 25 and a frequency extraction unit 41B, in addition to a PD unit 21, an amplifier unit 22, an A/D conversion unit 23, and a DMT demodulation unit 24. The VOA 25 is disposed at a stage before the PD unit 21 and attenuates an optical DMT modulation signal received from an optical transmission path 2. The frequency extraction unit 41B extracts part of a demodulation signal demodulated by the DMT demodulation unit 24.

The optical transmitter 10B includes a frequency analysis unit 17B, in addition to a DMT modulation unit 11, a D/A conversion unit 12, an amplifier unit 13, an LD unit 14, a bias control unit 18, and a bias supply unit 19. The frequency analysis unit 17B compares a monitor signal component acquired from the part of the demodulation signal extracted by the frequency extraction unit 41B of the optical receiver 20B with a monitor signal component from the DMT modulation unit 11. The frequency analysis unit 17B then acquires a harmonic distortion component of the monitor signal component on the basis of the result of comparison of the monitor signal components. As a result, the frequency analysis unit 17B can acquire the harmonic distortion component of the monitor signal component in which an effect from the monitor signal component of the demodulation signal is incorporated.

The bias control unit 18 of the optical transmitter 10B determines whether the harmonic distortion component of the monitor signal component of the frequency analysis unit 17B exceeds a predetermined threshold. When the harmonic distortion component of the monitor signal component exceeds the predetermined threshold, the bias control unit 18 adjusts the bias current amount of the bias supply unit 19 in order to reduce the harmonic distortion component of the monitor signal band of the optical DMT modulation signal. As a result, when the harmonic distortion component of the monitor signal component in which the effect from the demodulation signal is incorporated exceeds the predetermined threshold, the bias control unit 18 adjusts the bias current amount to be supplied to the LD unit 14. The bias control unit 18 can reduce not only the harmonic distortion component of the monitor signal component of the optical DMT modulation signal, but also the harmonic distortion component of the information signal component of the optical DMT modulation signal.

The optical transmitter 10B in the third embodiment adjusts the bias current amount to be supplied to the LD unit 14 in a direction in which the harmonic distortion component is reduced when the harmonic distortion component of the monitor signal component in which the effect from the demodulation signal on the optical receiver 20B side is incorporated exceeds the predetermined threshold. The harmonic distortion component of the monitor signal component is, as a result, reduced, so that the optical receiver 20B can reduce the harmonic distortion component with respect to the information signal component.

For convenience sake, in FIG. 11, the optical receiver 20B has been exemplarily described to include the amplifier unit 22 and the VOA 25 built therein and the optical transmitter 10B has been exemplarily described to include the amplifier unit 13 built therein. The amplifier unit 13 does not, however, have to be built in the optical transmitter 10B, and the amplifier unit 22 and the VOA 25 do not have to be built in the optical receiver 20B. Additionally, the bias current amount of the LD unit 14 inside the optical transmitter 10 is adjusted in the first embodiment described previously. Instead of adjusting the bias current amount, however, the gain amount of the amplifier unit 13 may be adjusted. The following describes a fourth embodiment in which the gain amount of the amplifier unit is adjusted.

[d] Fourth Embodiment

Figure 12:
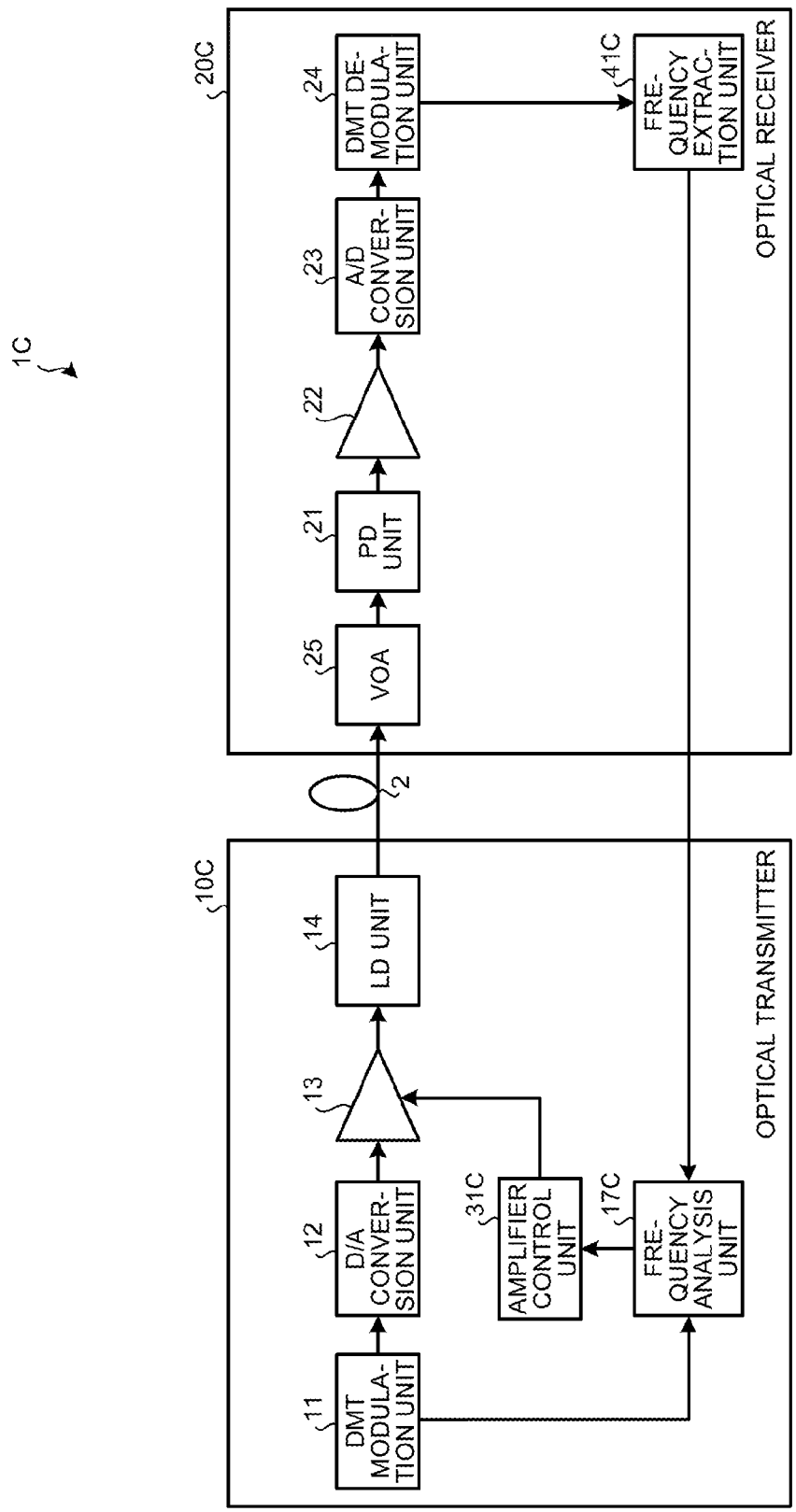
FIG. 12 is an example block diagram illustrating an optical transmission system according to a fourth embodiment.

FIG. 12 is an example block diagram illustrating an optical transmission system according to a fourth embodiment. In the fourth embodiment, like or corresponding elements are identified by the same reference numerals as those used for the elements described with reference to the first embodiment and descriptions for arrangements and operations of those elements will not be duplicated. This optical transmission system 1C illustrated in FIG. 12 includes an optical transmitter 10C and an optical receiver 20C. The optical receiver 20C includes a VOA 25 and a frequency extraction unit 41C, in addition to a PD unit 21, an amplifier unit 22, an A/D conversion unit 23, and a DMT demodulation unit 24. The VOA 25 is disposed at a stage before the PD unit 21 and attenuates an optical DMT modulation signal received from an optical transmission path 2. The frequency extraction unit 41C extracts part of a demodulation signal demodulated by the DMT demodulation unit 24.

The optical transmitter 10C includes a frequency analysis unit 17C and an amplifier control unit 31C, in addition to a DMT modulation unit 11, a D/A conversion unit 12, an amplifier unit 13, and an LD unit 14. The frequency analysis unit 17C compares a monitor signal component of the demodulation signal extracted by the frequency extraction unit 41C of the optical receiver 20C with a monitor signal component from the DMT modulation unit 11. The frequency analysis unit 17C then acquires a harmonic distortion component of the monitor signal component on the basis of the result of comparison of the monitor signal components. The amplifier control unit 31C adjusts the gain amount of the amplifier unit 13.

The amplifier control unit 31C of the optical transmitter 10C determines whether the harmonic distortion component of the monitor signal component of the frequency analysis unit 17C exceeds a predetermined threshold. When the harmonic distortion component of the monitor signal component exceeds the predetermined threshold, the amplifier control unit 31C adjusts the gain amount of the amplifier unit 13 so that the gain amount of the amplifier unit 13 illustrated in FIG. 10 is equal to or less than a in order to reduce the harmonic distortion component of the monitor signal component of the DMT modulation signal. As a result, by adjusting the gain amount of the amplifier unit 13, the amplifier control unit 31C can reduce not only the harmonic distortion component of the monitor signal component, but also the harmonic distortion component of the information signal component.

When the harmonic distortion component of the monitor signal component does not exceed the predetermined threshold, the amplifier control unit 31C fixes a set gain amount of the amplifier unit 13. It is noted that, when the harmonic distortion component of the monitor signal does not exceed the predetermined threshold, the amplifier control unit 31C can assume that the harmonic distortion component of the information signal component of the optical DMT modulation signal is so small as not to affect the transmission.

When the harmonic distortion component of the monitor signal component in which the effect from the demodulation signal on the optical receiver 20C side is incorporated exceeds the predetermined threshold, the optical transmitter 10C adjusts the gain amount of the amplifier unit 13 in a direction in which the harmonic distortion component is reduced. As a result, by adjusting the gain amount of the amplifier unit 13, the optical transmitter 10C can also reduce the harmonic distortion component with respect to the information signal component so as to reduce the harmonic distortion component of the monitor signal component.

For convenience sake, the optical receiver 20C illustrated in FIG. 12 has been exemplarily described to include the amplifier unit 22 and the VOA 25 built therein. The amplifier unit 22 and the VOA 25 do not, however, have to be built in the optical receiver 20C. It is noted that, in the optical transmission system 1 according to the first embodiment described previously, the bias current amount of the LD unit 14 of the optical transmitter 10 is adjusted in the direction in which the harmonic distortion component of the monitor signal component is reduced. Instead of the LD unit 14, however, the amplifier unit 22 on the optical receiver 20 side may be adjusted. The following describes a fifth embodiment in which the amplifier unit on the optical receiver side is adjusted.

[e] Fifth Embodiment

Figure 13:
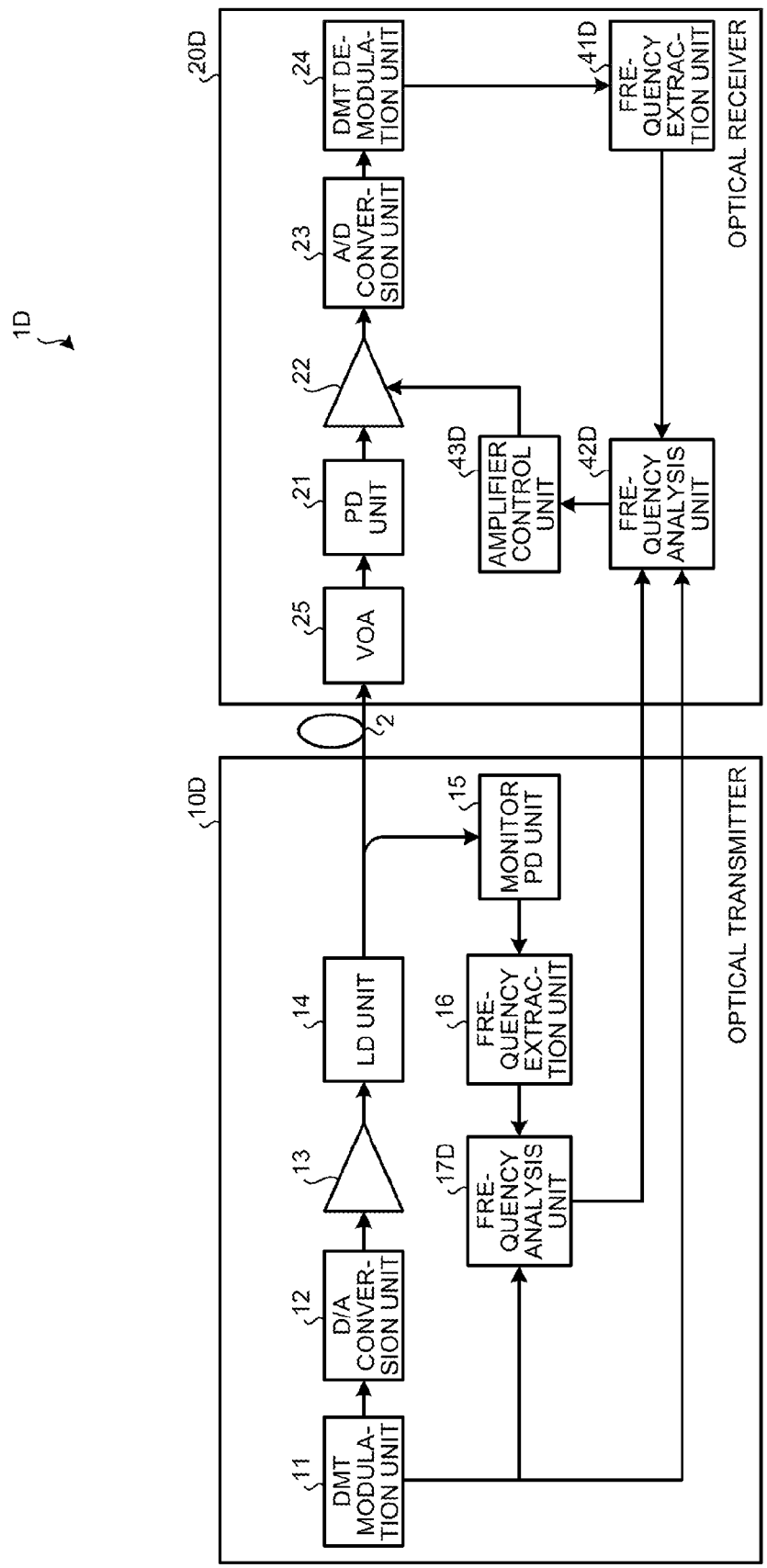
FIG. 13 is an example block diagram illustrating an optical transmission system according to a fifth embodiment.

FIG. 13 is an example block diagram illustrating an optical transmission system according to a fifth embodiment. In the fifth embodiment, like or corresponding elements are identified by the same reference numerals as those used for the elements described with reference to the first embodiment and descriptions for arrangements and operations of those elements will not be duplicated. This optical transmission system 1D illustrated in FIG. 13 includes an optical transmitter 10D and an optical receiver 20D. The optical transmitter 10D includes a frequency analysis unit 17D, in addition to a DMT modulation unit 11, a D/A conversion unit 12, an amplifier unit 13, an LD unit 14, a monitor PD unit 15, and a frequency extraction unit 16. The frequency analysis unit 17D compares a monitor signal component of part of the optical DMT modulation signal extracted by the frequency extraction unit 16 with a monitor signal component from the DMT modulation unit 11. The frequency analysis unit 17D then acquires a harmonic distortion component of the monitor signal component on the basis of the result of comparison of the monitor signal components.

The optical receiver 20D includes a VOA 25, a frequency extraction unit 41D, a frequency analysis unit 42D, and an amplifier control unit 43D, in addition to a PD unit 21, an amplifier unit 22, an A/D conversion unit 23, and a DMT demodulation unit 24. The VOA 25 is disposed at a stage before the PD unit 21 and attenuates an optical DMT modulation signal received from an optical transmission path 2. The frequency extraction unit 41D extracts part of a demodulation signal demodulated by the DMT demodulation unit 24. The frequency analysis unit 42D acquires a monitor signal component of the demodulation signal extracted by the frequency extraction unit 41D, a monitor signal component of the DMT modulation signal of the DMT modulation unit 11 on the optical transmitter 10D side, and a monitor signal component of the optical DMT modulation signal of the frequency analysis unit 17D on the optical transmitter 10D side. The frequency analysis unit 42D compares the monitor signal component of the demodulation signal, the monitor signal component of the DMT modulation signal, and the monitor signal component of the optical DMT modulation signal and, on the basis of the result of comparison among these signals, acquires the harmonic distortion component of the monitor signal component.

The amplifier control unit 43D adjusts the gain amount of the amplifier unit 22 of the optical receiver 20D. The amplifier control unit 43D determines whether the harmonic distortion component of the monitor signal component of the frequency analysis unit 42D exceeds a predetermined threshold. When the harmonic distortion component of the monitor signal component exceeds the predetermined threshold, the amplifier control unit 43D adjusts the gain amount of the amplifier unit 22 so that the gain amount is equal to or less than a as illustrated in FIG. 10 in order to reduce the harmonic distortion of the monitor signal component of the DMT modulation signal electrically converted by the PD unit 21. As a result, by adjusting the gain amount of the amplifier unit 22, the amplifier control unit 43D can reduce, on the optical receiver 20D side, not only the harmonic distortion component of the monitor signal component of the DMT modulation signal, but also the harmonic distortion component of the information signal component of the DMT modulation signal.

When the harmonic distortion component of the monitor signal component does not exceed the predetermined threshold, the amplifier control unit 43D fixes a set gain amount of the amplifier unit 22. It is noted that, when the harmonic distortion component of the monitor signal does not exceed the predetermined threshold, the amplifier control unit 43D can assume that the harmonic distortion component of the information signal component of the optical DMT modulation signal is so small as not to affect the transmission.

The frequency analysis unit 42D of the optical receiver 20D in the fifth embodiment can acquire the harmonic distortion component of the monitor signal component in which effects from the monitor signal component of the demodulation signal, the monitor signal component of the DMT modulation signal of the DMT modulation unit 11, and the monitor signal component of the optical DMT modulation signal are incorporated.

When the harmonic distortion component of the monitor signal component of the frequency analysis unit 42D exceeds the predetermined threshold, the amplifier control unit 43D adjusts the gain amount of the amplifier unit 22 in a direction in which the harmonic distortion component is reduced. As a result, by reducing the harmonic distortion component of the monitor signal component, the optical receiver 20D can also reduce the harmonic distortion component with respect to the information signal component.

For convenience sake, in FIG. 13, the optical transmitter 10D has been exemplarily described to include the amplifier unit 13 built therein and the optical receiver 20D has been exemplarily described to include the VOA 25 built therein. The amplifier unit 13 and the VOA 25 do not, however, have to be built in the optical transmitter 10D and the optical receiver 20D, respectively. In addition, in the optical receiver 20D of the optical transmission system 1D according to the fifth embodiment described above, the gain amount of the amplifier unit 22 is adjusted in the direction in which the harmonic distortion component is reduced. Instead, an attenuation amount of the VOA 25 may nonetheless be adjusted. The following describes a sixth embodiment in which the attenuation amount of the VOA is adjusted.

[f] Sixth Embodiment

Figure 14:
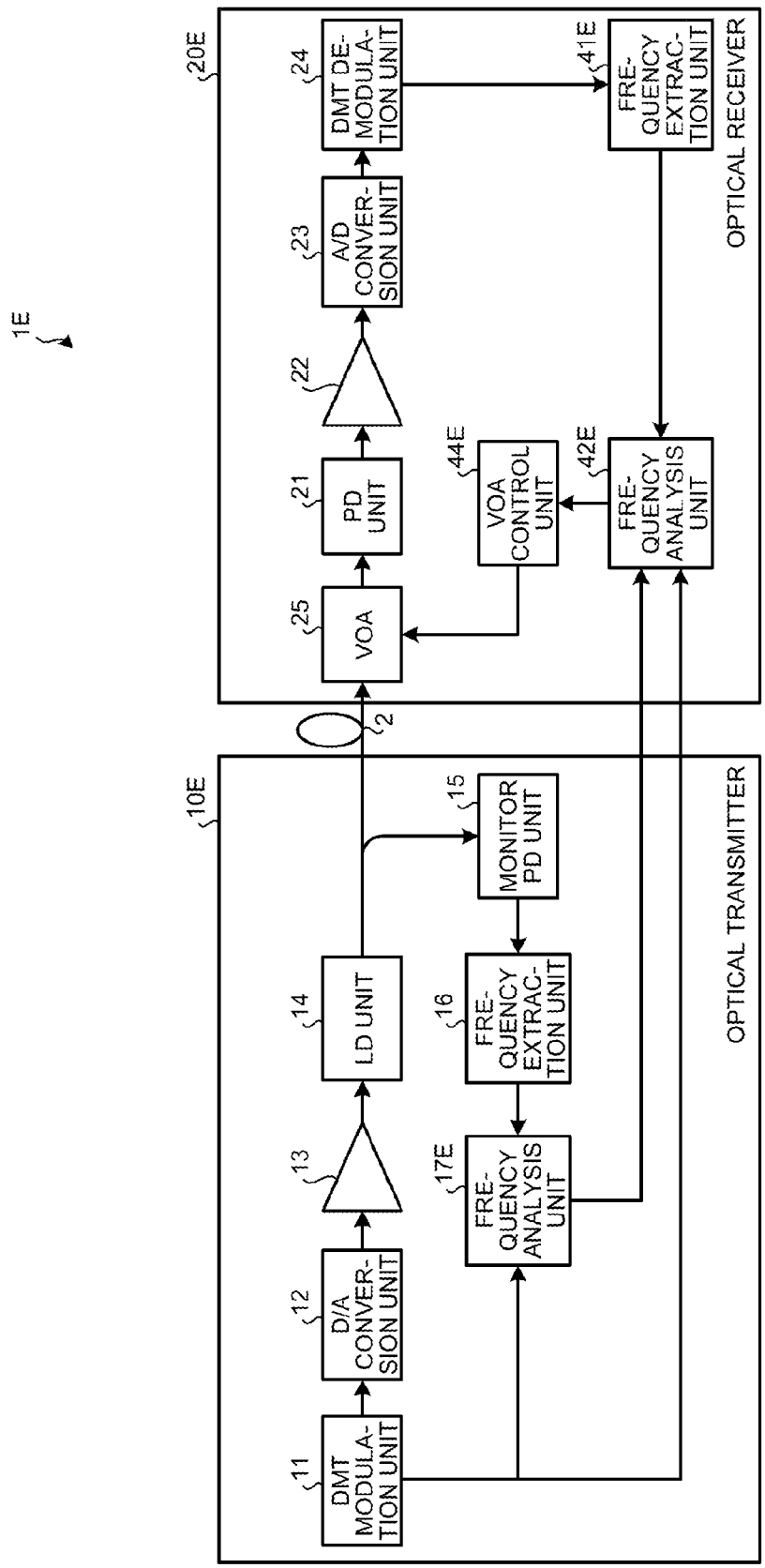
FIG. 14 is an example block diagram illustrating an optical transmission system according to a sixth embodiment.

FIG. 14 is an example block diagram illustrating an optical transmission system according to a sixth embodiment. In the sixth embodiment, like or corresponding elements are identified by the same reference numerals as those used for the elements described with reference to the optical transmission system 1D in the fifth embodiment and descriptions for arrangements and operations of those elements will not be duplicated.

This optical transmission system 1E illustrated in FIG. 14 includes an optical transmitter 10E and an optical receiver 20E. The optical transmitter 10E includes a frequency analysis unit 17E, in addition to a DMT modulation unit 11, a D/A conversion unit 12, an amplifier unit 13, an LD unit 14, a monitor PD unit 15, and a frequency extraction unit 16. The frequency analysis unit 17E compares a monitor signal component of the optical DMT modulation signal from the frequency extraction unit 16 with a monitor signal component from the DMT modulation unit 11. The frequency analysis unit 17E then acquires a harmonic distortion component of the monitor signal component on the basis of the result of comparison of the monitor signal components.

The optical receiver 20E includes a VOA 25, a frequency extraction unit 41E, a frequency analysis unit 42E, and a VOA control unit 44E, in addition to a PD unit 21, an amplifier unit 22, an A/D conversion unit 23, and a DMT demodulation unit 24. The VOA 25 is disposed at a stage before the PD unit 21 and attenuates an optical DMT modulation signal received from an optical transmission path 2. The frequency extraction unit 41E extracts part of a demodulation signal demodulated by the DMT demodulation unit 24. The frequency analysis unit 42E acquires a monitor signal component of the demodulation signal extracted by the frequency extraction unit 41E, a monitor signal component of the DMT modulation signal of the DMT modulation unit 11 on the optical transmitter 10E side, and a monitor signal component of the optical DMT modulation signal of the frequency analysis unit 17E on the optical transmitter 10E side. The frequency analysis unit 42E compares the monitor signal component of the demodulation signal, the monitor signal component of the DMT modulation signal, and the monitor signal component of the optical DMT modulation signal and, on the basis of the result of comparison among these signals, acquires the harmonic distortion component of the monitor signal component.

The VOA control unit 44E adjusts an attenuation amount of the VOA 25 in the optical receiver 20E. The VOA control unit 44E determines whether the harmonic distortion component of the monitor signal component of the frequency analysis unit 42E exceeds a predetermined threshold. When the harmonic distortion component of the monitor signal component exceeds the predetermined threshold, the VOA control unit 44E adjusts the attenuation amount of the VOA 25 in a direction in which the harmonic distortion component of the monitor signal component of the optical DMT modulation signal received from the optical transmission path 2 is reduced. As a result, the VOA control unit 44E can reduce, on the optical receiver 20E side, not only the harmonic distortion component of the monitor signal component, but also the harmonic distortion component of the information signal component by adjusting the attenuation amount of the VOA 25.

When the harmonic distortion component of the monitor signal component does not exceed the predetermined threshold, the VOA control unit 44E fixes a set attenuation amount of the VOA 25. It is noted that, when the harmonic distortion component of the monitor signal does not exceed the predetermined threshold, the VOA control unit 44E can assume that the harmonic distortion component of the information signal component of the optical DMT modulation signal is so small as not to affect the transmission.

The frequency analysis unit 42E of the optical receiver 20E in the sixth embodiment can acquire the harmonic distortion component of the monitor signal component in which effects from the monitor signal component of the demodulation signal, the monitor signal component of the DMT modulation signal of the DMT modulation unit 11, and the monitor signal component of the optical DMT modulation signal are incorporated.

When the harmonic distortion component of the monitor signal component of the frequency analysis unit 42E exceeds the predetermined threshold, the optical receiver 20E adjusts the attenuation amount of the VOA 25 in a direction in which the harmonic distortion component is reduced. As a result, by reducing the harmonic distortion component of the monitor signal component, the optical receiver 20E can also reduce the harmonic distortion component with respect to the information signal component.

For convenience sake, in FIG. 14, the optical transmitter 10E has been exemplarily described to include the amplifier unit 13 built therein and the optical receiver 20E has been exemplarily described to include the amplifier unit 22 built therein. The amplifier unit 13 and the amplifier unit 22 do not, however, have to be built in the optical transmitter 10E and the optical receiver 20E, respectively. In the optical transmission system 1 according to the first embodiment described previously, the bias current amount of the LD unit 14 is adjusted in the direction in which the harmonic distortion component of the monitor signal component is reduced on the basis of the harmonic distortion component of the monitor signal component of the optical DMT modulation signal on the optical transmitter 10 side. Nonetheless, the gain amount of the amplifier unit 22 on the optical receiver 20 side may also be adjusted, in addition to the bias current amount of the LD unit 14 on the optical transmitter 10 side. The following describes a seventh embodiment in which the gain amount of the amplifier unit on the optical receiver side is adjusted, in addition to the bias current amount of the LD unit on the optical transmitter side.

[g] Seventh Embodiment

Figure 15:
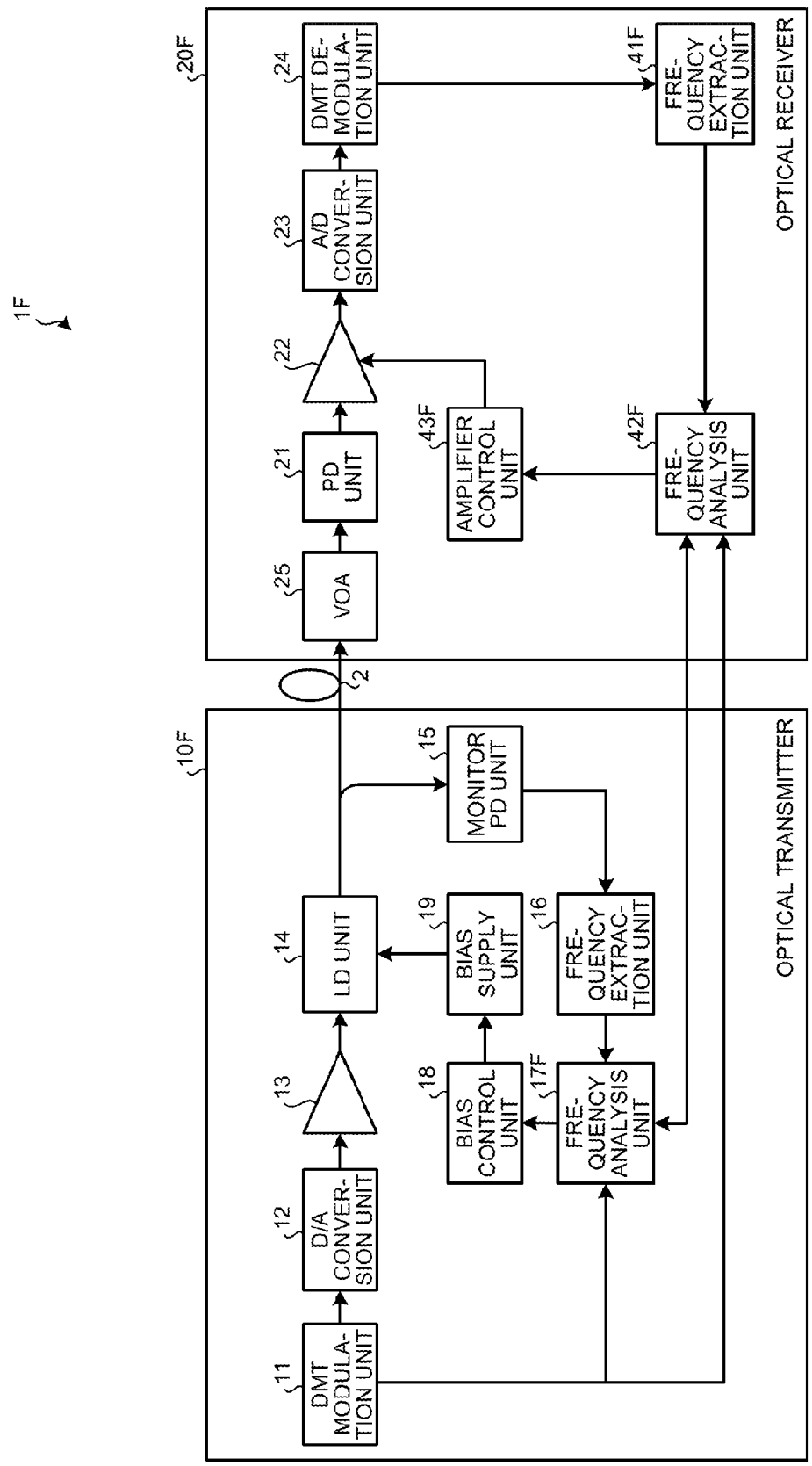
FIG. 15 is an example block diagram illustrating an optical transmission system according to a seventh embodiment.

FIG. 15 is an example block diagram illustrating an optical transmission system according to a seventh embodiment. In the seventh embodiment, like or corresponding elements are identified by the same reference numerals as those used for the elements described with reference to the optical transmission system 1 in the first embodiment and descriptions for arrangements and operations of those elements will not be duplicated. This optical transmission system 1F illustrated in FIG. 15 includes an optical transmitter 10F and an optical receiver 20F. The optical transmitter 10F includes a frequency analysis unit 17F, in addition to a DMT modulation unit 11, a D/A conversion unit 12, an amplifier unit 13, an LD unit 14, a monitor PD unit 15, a frequency extraction unit 16, a bias control unit 18, and a bias supply unit 19. The frequency analysis unit 17F compares a monitor signal component of the optical DMT modulation signal from the frequency extraction unit 16 with a monitor signal component from the DMT modulation unit 11. The frequency analysis unit 17F then acquires a harmonic distortion component of the monitor signal component on the basis of the result of comparison of the monitor signal components.

The optical receiver 20F includes a VOA 25, a frequency extraction unit 41F, a frequency analysis unit 42F, and an amplifier control unit 43F, in addition to a PD unit 21, an amplifier unit 22, an A/D conversion unit 23, and a DMT demodulation unit 24. The VOA 25 is disposed at a stage before the PD unit 21 and attenuates an optical DMT modulation signal received from an optical transmission path 2. The frequency extraction unit 41F extracts part of a demodulation signal demodulated by the DMT demodulation unit 24. The frequency analysis unit 42F acquires a monitor signal component of the demodulation signal, a monitor signal component of the DMT modulation signal of the DMT modulation unit 11 on the optical transmitter 10F side, and a monitor signal component of the optical DMT modulation signal of the frequency analysis unit 17F on the optical transmitter 10F side. The frequency analysis unit 42F compares the monitor signal component of the demodulation signal, the monitor signal component of the DMT modulation signal, and the monitor signal component of the optical DMT modulation signal and, on the basis of the result of comparison among these signals, acquires the harmonic distortion component of the monitor signal component.

The amplifier control unit 43F adjusts a gain amount of the amplifier unit 22 in the optical receiver 20F. The amplifier control unit 43F determines whether the harmonic distortion component of the monitor signal component of the frequency analysis unit 42F exceeds a predetermined threshold. When the harmonic distortion component of the monitor signal component exceeds the predetermined threshold, the amplifier control unit 43F adjusts the gain amount of the amplifier unit 22 in order to reduce the harmonic distortion component of the monitor signal component of the DMT modulation signal electrically converted by the PD unit 21. As a result, the amplifier control unit 43F can reduce, on the optical receiver 20F side, not only the harmonic distortion component of the monitor signal component, but also the harmonic distortion component of the information signal component by adjusting the gain amount of the amplifier unit 22.

When the harmonic distortion component of the monitor signal component does not exceed the predetermined threshold, the amplifier control unit 43F fixes a set attenuation amount of the amplifier unit 22. It is noted that, when the harmonic distortion component of the monitor signal does not exceed the predetermined threshold, the amplifier control unit 43F can assume that the harmonic distortion component of the information signal component of the optical DMT modulation signal is so small as not to affect the transmission.

The optical transmission system 1F in the seventh embodiment adjusts the gain amount of the amplifier unit 22 on the optical receiver 20F side as well as the bias current amount of the LD unit 14 on the optical transmitter 10F side in order to reduce the harmonic distortion component of the monitor signal component. As a result, the reduction in the harmonic distortion component of the monitor signal component by both the optical transmitter 10F and the optical receiver 20F allows the harmonic distortion component with respect to the information signal component of the entire optical transmission system 1F to be reduced.

For convenience sake, in FIG. 15, the optical transmitter 10F has been exemplarily described to include the amplifier unit 13 built therein and the optical receiver 20F has been exemplarily described to include the VOA 25 built therein. The amplifier unit 13 and the VOA 25 do not, however, have to be built in the optical transmitter 10F and the optical receiver 20F, respectively. In the optical transmission system 1 according to the first embodiment described previously, the bias current amount of the LD unit 14 is adjusted in the direction in which the harmonic distortion component of the monitor signal is reduced on the basis of the harmonic distortion component of the monitor signal component of the optical DMT modulation signal extracted by the monitor PD unit 15 on the optical transmitter 10 side. Nonetheless, the attenuation amount of the VOA 25 on the optical receiver 20 side may also be adjusted, in addition to the bias current amount of the LD unit 14 on the optical transmitter 10 side. The following describes an eighth embodiment in which the attenuation amount of the VOA on the optical receiver side is adjusted, in addition to the bias current amount of the LD unit on the optical transmitter side.

[h] Eighth Embodiment

Figure 16:
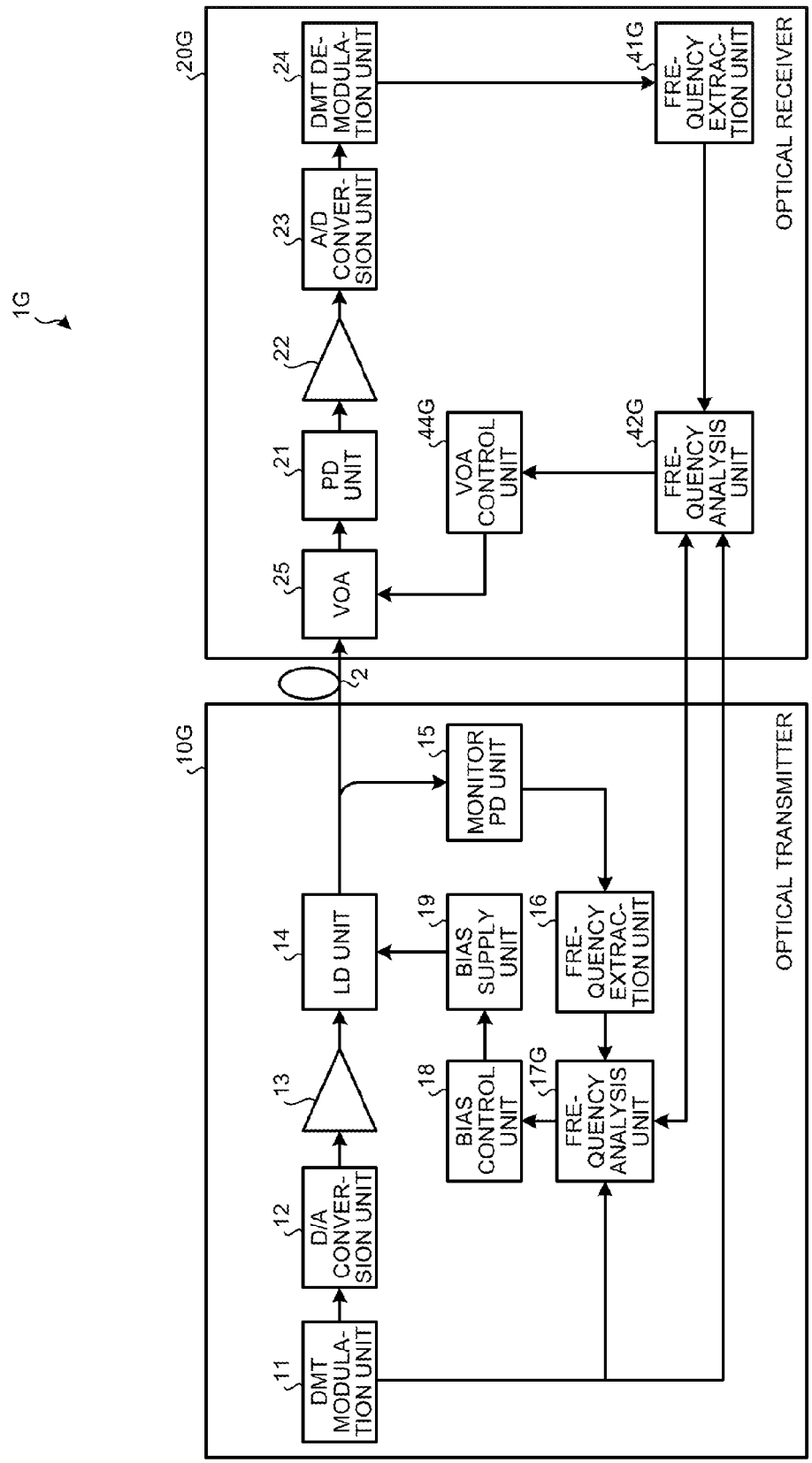
FIG. 16 is an example block diagram illustrating an optical transmission system according to an eighth embodiment.

FIG. 16 is an example block diagram illustrating an optical transmission system according to an eighth embodiment. In the eighth embodiment, like or corresponding elements are identified by the same reference numerals as those used for the elements described with reference to the optical transmission system 1 in the first embodiment and descriptions for arrangements and operations of those elements will not be duplicated. This optical transmission system 1G illustrated in FIG. 16 includes an optical transmitter 10G and an optical receiver 20G. The optical transmitter 10G includes a frequency analysis unit 17G, in addition to a DMT modulation unit 11, a D/A conversion unit 12, an amplifier unit 13, an LD unit 14, a monitor PD unit 15, a frequency extraction unit 16, a bias control unit 18, and a bias supply unit 19. The frequency analysis unit 17G compares a monitor signal component of the optical DMT modulation signal from the frequency extraction unit 16 with a monitor signal component from the DMT modulation unit 11. The frequency analysis unit 17G then acquires a harmonic distortion component of the monitor signal component on the basis of the result of comparison of the monitor signal components.

The optical receiver 20G includes a VOA 25, a frequency extraction unit 41G, a frequency analysis unit 42G, and a VOA control unit 44G, in addition to a PD unit 21, an amplifier unit 22, an A/D conversion unit 23, and a DMT demodulation unit 24. The VOA 25 is disposed at a stage before the PD unit 21 and attenuates an optical DMT modulation signal received from an optical transmission path 2. The frequency extraction unit 41G extracts part of a demodulation signal demodulated by the DMT demodulation unit 24. The frequency analysis unit 42G acquires a monitor signal component of the demodulation signal, a monitor signal component of the DMT modulation signal of the DMT modulation unit 11 on the optical transmitter 10G side, and a monitor signal component of the optical DMT modulation signal of the frequency analysis unit 17G on the optical transmitter 10G side. The frequency analysis unit 42G compares the monitor signal component of the demodulation signal, the monitor signal component of the DMT modulation signal, and the monitor signal component of the optical DMT modulation signal and, on the basis of the result of comparison among these signals, acquires the harmonic distortion component of the monitor signal component.

The VOA control unit 44G adjusts an attenuation amount of the VOA 25 in the optical receiver 20G. The VOA control unit 44G determines whether the harmonic distortion component of the monitor signal component of the frequency analysis unit 42G exceeds a predetermined threshold. When the harmonic distortion component of the monitor signal component exceeds the predetermined threshold, the VOA control unit 44G adjusts the attenuation amount of the VOA 25 in order to reduce the harmonic distortion of the monitor signal component of the optical DMT modulation signal received from the optical transmission path 2. As a result, the VOA control unit 44G can reduce, on the optical receiver 20G side, not only the harmonic distortion component of the monitor signal component, but also the harmonic distortion component of the information signal component by adjusting the attenuation amount of the VOA 25.

When the harmonic distortion component of the monitor signal component does not exceed the predetermined threshold, the VOA control unit 44G fixes a set attenuation amount of the VOA 25. It is noted that, when the harmonic distortion component of the monitor signal does not exceed the predetermined threshold, the VOA control unit 44G can assume that the harmonic distortion component of the information signal component of the optical DMT modulation signal is so small as not to affect the transmission.

The optical transmission system 1G in the eighth embodiment adjusts the attenuation amount of the VOA 25 on the optical receiver 20G side as well as the bias current amount of the LD unit 14 on the optical transmitter 10G side in order to reduce the harmonic distortion component of the monitor signal component. As a result, the reduction in the harmonic distortion component of the monitor signal component by both the optical transmitter 10G and the optical receiver 20G allows the harmonic distortion component with respect to the information signal component of the entire optical transmission system 1G to be reduced.

For convenience sake, in FIG. 16, the optical transmitter 10G has been exemplarily described to include the amplifier unit 13 built therein and the optical receiver 20G has been exemplarily described to include the amplifier unit 22 built therein. The amplifier unit 13 and the amplifier unit 22 do not, however, have to be built in the optical transmitter 10G and the optical receiver 20G, respectively. Additionally, in the second to the eighth embodiments described above, the DMT modulation unit 11 multiplexes the monitor signal to the lower frequency side of the frequency band of the information signal. The monitor signal may be multiplexed to the higher frequency side of the frequency band of the information signal. In this case, because of the monitor signal in the high-frequency band, the distortion of high-frequency devices such as the amplifier unit 13 and the LD unit 14 tends to occur on the higher frequency side. This trend improves accuracy in monitoring the harmonic distortion component with respect to the monitor signal.

In the second to eighth embodiments described above, the frequency analysis unit 17 (17B to 17G) extracts the harmonic distortion component with respect to the monitor signal of the optical DMT modulation signal. Intermodulation distortion may nonetheless be extracted. The bias control unit 18 controls the bias supply unit 19 on the basis of the extracted intermodulation distortion in order to adjust the bias current amount so as to reduce the intermodulation distortion of the monitor signal band of the optical DMT modulation signal. The optical transmitter 10 (10A to 10G) can, as a result, reduce mutual distortion of the information signal component of the optical DMT modulation signal by reducing mutual distortion of the monitor signal component.

In the second to eighth embodiments described above, the multi-value degree of the information signal band of the DMT modulation signal is preferably set high. The multi-value degree of channels of the monitor signal band may nonetheless be low.

In the second to eighth embodiments described above, an LPF is exemplarily used for the frequency extraction unit 16 (41B to 41G). When the monitor signal band exists on the higher frequency side of the information signal band of the optical DMT modulation signal (or demodulation signal), however, the frequency extraction unit 16 (41B to 41G) may extract the monitor signal component of the monitor signal band using an LPF following downconversion using, for example, a narrow-bandwidth mixer. Alternatively, the monitor signal may be first donwconverted to the monitor signal band disposed on the higher frequency side and the monitor signal component of the monitor signal band may then be extracted using a low-frequency D/A conversion circuit. Still alternatively, the harmonic component of the monitor signal may be extracted using a narrow-bandwidth band pass filter (BPF) for use in the control.

While the DMT modulation signal is directly modulated by the LD unit 14 in the second to eighth embodiments described above, a modulator of an external modulation scheme may, for example, be employed in which a DMT modulation signal that multiplexes a monitor signal and an information signal is optically converted to a corresponding optical DMT modulation signal. Non-limiting examples of the modulator of the external modulation scheme include an electronic absorption (EA) modulator and a LiNbO3 (LN) modulator. The EA modulator and the LN modulator have, for example, a region in which distortion in a linear region occurs depending on the bias current amount and modulation amplitude. When the EA modulator or the LN modulator optically converts the DMT modulation signal that multiplexes the monitor signal and the information signal to a corresponding optical DMT modulation signal, therefore, the bias control unit 18 extracts the harmonic distortion component of the monitor signal component from part of the optical DMT modulation signal thus optically converted by the modulator. When the extracted harmonic distortion component exceeds a predetermined threshold, the bias control unit 18 further adjusts the bias current to be supplied to the EA modulator or the LN modulator in a direction in which the harmonic distortion component is reduced. The bias current to be supplied to the EA modulator or the LN modulator can thereby be adjusted, so that the harmonic distortion component with respect to the information signal component of the optical DMT modulation signal can be reduced.

While the second to eighth embodiments described above have been exemplified by the optical transmitters 10A to 10G according to the DMT modulation scheme, the present invention can still be applied to an optical transmitter of the multicarrier modulation scheme that multiplexes the information signal with a plurality of subcarrier signals. Examples of the multicarrier modulation scheme include the OFDM modulation scheme and various types of PSK modulation schemes including the QPSK modulation scheme. The present invention is likewise applicable to DPSK and 8PSK.

While the second to eighth embodiments described above have been described to include the optical transmitter 10A (10B to 10G) and the optical receiver 20A (20B to 20G) as individual elements separated from each other, an embodiment is still possible in which a single optical module includes the optical transmitter 10A (10B to 10G) and the optical receiver 20A (20B to 20G) built therein.

Each of the elements of the units illustrated with reference to the accompanying drawings does not necessarily have to be configured physically as illustrated. Specifically, specific modes of distribution and integration of each unit are not limited to those illustrated in the drawings and the units may be, in whole or in part, functionally or physically distributed or integrated as appropriate in any units depending on, for example, specific load or use condition.

Additionally, the various types of processing functions performed by each unit may be performed, in whole or in any part, on a central processing unit (CPU) (or a microcomputer, such as a microprocessing unit (MPU) and a microcontroller unit (MCU)). Understandably, the various types of processing functions may even be performed, in whole or in any part, on a computer program analyzed and executed on the CPU (or a microcomputer, such as an MPU and an MCU) or on wired-logic hardware.

Figure 17:
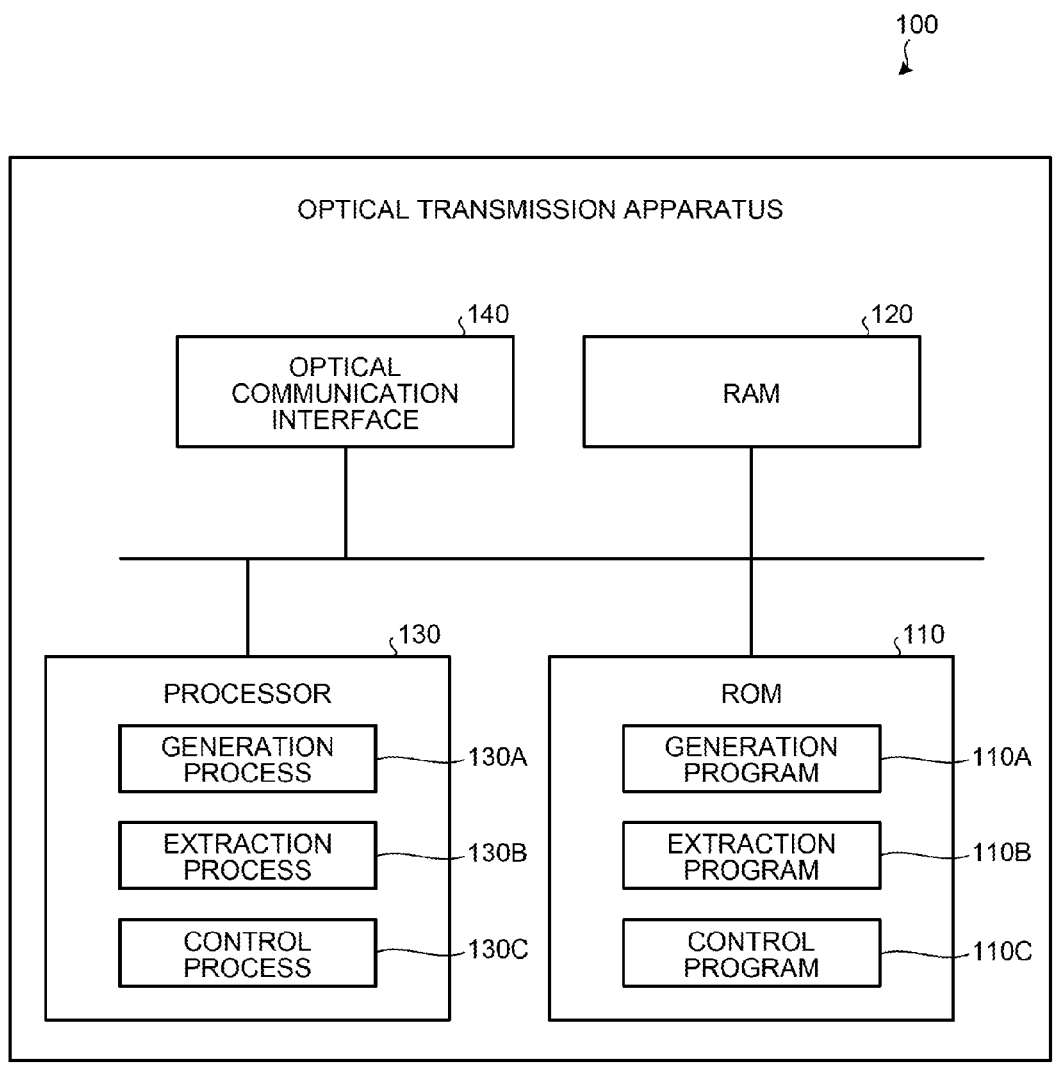
FIG. 17 is a block diagram illustrating an optical transmission apparatus that executes an optical signal processing program.

Various types of processing described with reference to the foregoing embodiments can be achieved by a previously prepared computer program executed on an optical module. The following describes an example optical transmission apparatus, such as an optical module that executes a computer program having functions similar to those of the above-described embodiments. FIG. 17 is a block diagram illustrating an optical transmission apparatus 100 that executes an optical signal processing program.

In FIG. 17, the optical transmission apparatus 100 that executes the optical signal processing program includes a ROM 110, a RAM 120, a processor 130, and an optical communication interface 140.

The ROM 110 stores in advance an optical signal processing program that exhibits functions similar to those of the above-described embodiments. The optical signal processing program may be recorded in a recording medium that can be read by a drive not illustrated, instead of the ROM 110. Alternatively, the recording medium may, for example, be a CD-ROM, a DVD disc, a portable recording medium such as a USB memory and an SD card, and a semiconductor memory such as a flash memory. The optical signal processing program may still be acquired from a storage capable of communication over a network. The optical signal processing program includes a generation program 110A, an extraction program 110B, and a control program 110C as illustrated in FIG. 17. The generation program 110A, the extraction program 110B, and the control program 110C may be integrated or distributed as appropriate.

The processor 130 loads the generation program 110A, the extraction program 110B, and the control program 110C from the ROM 110 and executes each loaded program. The generation program 110A, the extraction program 110B, and the control program 110C cause the processor 130 to function as a generation process 130A, an extraction process 130B, and a control process 130C, respectively.

The processor 130 modulates a carrier signal having a specific frequency with an information signal and a carrier signal having a frequency different from the specific frequency with a monitor signal, to thereby generate in the optical communication interface 140 a multicarrier modulation signal that multiplexes the information signal and the monitor signal. The processor 130 further causes a distortion component of the monitor signal to be extracted from the multicarrier modulation signal. The processor 130 controls the optical communication interface 140 that adjusts the multicarrier modulation signal such that the extracted distortion component of the monitor signal is reduced. As a result, the optical transmission apparatus 100 can reduce distortion with respect to an information signal component of the optical multicarrier modulation signal by reducing the distortion of the monitor signal component. Nonlinear distortion of the optical multicarrier modulation signal can then be reduced.

The disclosed embodiments can reduce nonlinear distortion of the optical multicarrier modulation signal of the multicarrier modulation scheme.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical signal processing apparatus comprising:
a modulator that modulates a first carrier signal having a specific frequency with an information signal to generate a first modulation signal, modulates a second carrier signal having a frequency different from the specific frequency with a monitor signal to generate a second modulation signal, and multiplexes the first modulation signal and the second modulation signal to generate a multicarrier modulation signal;
a first adjuster that adjusts the multicarrier modulation signal;
a convertor that is included in the first adjuster and converts the multicarrier modulation signal into an optical multicarrier modulation signal;
an extractor that extracts a first component of the monitor signal from the optical multicarrier modulation signal, and compares the first component with a second component of the monitor signal modulated by the modulator to extract an optical distortion component of the monitor signal, the optical distortion component being one of a harmonic distortion component and an intermodulation distortion component; and
a controller that controls the convertor to reduce the optical distortion component of the monitor signal extracted by the extractor.

2. The optical signal processing apparatus according to claim 1, wherein the modulator modulates, with the monitor signal, the first carrier signal having a frequency on a lower frequency side than a band of the specific frequency of the second carrier signal modulated with the information signal.

3. The optical signal processing apparatus according to claim 1, wherein the modulator modulates, with the monitor signal, the first carrier signal having a frequency on a higher frequency side than the band of the specific frequency of the second carrier signal modulated with the information signal.

4. The optical signal processing apparatus according to claim 1, wherein the extractor receives the optical multicarrier modulation signal through an optical transmission path connected to an opposite apparatus connected to the optical signal processing apparatus, converts the received optical multicarrier modulation signal into the multicarrier modulation signal, demodulates the multicarrier modulation signal into a demodulation signal including the information signal and the monitor signal and extracts the optical distortion component of the monitor signal from the demodulation signal.

5. The optical signal processing apparatus according to claim 1, wherein the controller controls an amplifier in the first adjuster to reduce the optical distortion component of the monitor signal, the amplifier adjusting a gain amount of the multicarrier modulation signal.

6. The optical signal processing apparatus according to claim 1, wherein the controller controls an attenuator in a second adjuster in an opposite apparatus connected to the optical signal processing apparatus through an optical transmission path to reduce the optical distortion component of the monitor signal, the attenuator adjusting an attenuation amount of the optical multicarrier modulation signal received through the optical transmission path.

7. The optical signal processing apparatus according to claim 1, wherein the controller controls an amplifier in a second adjuster in an opposite apparatus connected to the optical signal processing apparatus through an optical transmission path to reduce the optical distortion component of the monitor signal, the amplifier adjusting a gain amount of the multicarrier modulation signal received through the optical transmission path.

8. An optical signal processing method of an optical signal processing apparatus to execute a process comprising:

modulating a first carrier signal having a specific frequency with an information signal to generate a first modulation signal, modulating a second carrier signal having a frequency different from the specific frequency with a monitor signal to generate a second modulation signal, and multiplexing the first modulation signal and the second modulation signal to generate a multicarrier modulation signal;

converting the multicarrier modulation signal into an optical multicarrier modulation signal;

extracting a first component of the monitor signal from the optical multicarrier modulation signal, and comparing the first component with a second component of the modulated monitor signal to extract an optical distortion component of the monitor signal, the optical distortion component being one of a harmonic distortion component and an intermodulation distortion component; and controlling the converting to reduce the extracted optical distortion component of the monitor signal.

9. A non-transitory computer-readable recording medium having stored therein an optical signal processing program that causes a processor of an optical signal processing apparatus to execute a process comprising:

modulating a first carrier signal having a specific frequency with an information signal to generate a first modulation signal, modulating a second carrier signal having a frequency different from the specific frequency with a monitor signal to generate a second modulation signal, and multiplexing the first modulation signal and the second modulation signal to generate a multicarrier modulation signal;

converting the multicarrier modulation signal into an optical multicarrier modulation signal;

extracting a first component of the monitor signal from the optical multicarrier modulation signal, and comparing the first component with a second component of the modulated monitor signal to extract an optical distortion component of the monitor signal, the optical distortion component being one of a harmonic distortion component and an intermodulation distortion component; and controlling the converting to reduce the extracted optical distortion component of the monitor signal.

* * * * *